United States Patent
Hasegawa

(10) Patent No.: US 9,142,443 B2
(45) Date of Patent: Sep. 22, 2015

(54) METHOD OF MANUFACTURING SEMICONDUCTOR DEVICE

(75) Inventor: Kazuhiko Hasegawa, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 9 days.

(21) Appl. No.: 13/540,547

(22) Filed: Jul. 2, 2012

(65) Prior Publication Data

US 2013/0011996 A1    Jan. 10, 2013

(30) Foreign Application Priority Data

Jul. 5, 2011    (JP) ................................ 2011-148802

(51) Int. Cl.
H01L 21/762    (2006.01)
H01L 21/311    (2006.01)
H01L 21/67    (2006.01)
H01L 21/8234    (2006.01)

(52) U.S. Cl.
CPC .... *H01L 21/76224* (2013.01); *H01L 21/31111* (2013.01); *H01L 21/6708* (2013.01); *H01L 21/823462* (2013.01)

(58) Field of Classification Search
USPC ........................................................ 438/424
See application file for complete search history.

(56) References Cited

U.S. PATENT DOCUMENTS

| 7,074,691 B2* | 7/2006 | Sato et al. ...................... 438/435 |
| 2004/0262265 A1* | 12/2004 | Funabashi et al. .............. 216/83 |
| 2008/0087936 A1* | 4/2008 | Kim .............................. 257/316 |
| 2008/0132059 A1* | 6/2008 | Noguchi et al. .............. 438/643 |

FOREIGN PATENT DOCUMENTS

| JP | 2004-179571 A | 6/2004 |
| JP | 2005-019665 A | 1/2005 |
| JP | 2006-173260 A | 6/2006 |
| JP | 2008-113028 A | 5/2008 |
| JP | 2009-049293 A | 3/2009 |
| WO | 2010/013683 A1 | 2/2010 |

OTHER PUBLICATIONS

Office Action for related Japanese Application No. 2011-148802, mailed Feb. 24, 2015 (citing Foreign Patent Documents 1-3).

* cited by examiner

*Primary Examiner* — Roy Potter
*Assistant Examiner* — Damian A Hillman
(74) *Attorney, Agent, or Firm* — Miles & Stockbridge P.C.

(57) ABSTRACT

To provide a semiconductor device having improved reliability at an improved production yield.

After forming an insulating film on the main surface of a semiconductor substrate as an oxide film, form a silicon nitride film on the insulating film. Then, form an element isolating trench by plasma dry etching, form an insulating film made of silicon oxide so as to fill the trench by using HDP-CVD, and remove the insulating film outside the trench by CMP, while leaving the insulating film in the trench. Then, remove the silicon nitride film, followed by removal of the insulating film by wet etching to expose the semiconductor substrate. At this time, the insulating film is wet etched while applying light of 140 lux or greater to the main surface of the semiconductor substrate.

16 Claims, 22 Drawing Sheets

METHOD OF MANUFACTURING SEMICONDUCTOR DEVICE

CROSS-REFERENCE TO RELATED APPLICATIONS

The disclosure of Japanese Patent Application No. 2011-148802 filed on Jul. 5, 2011 including the specification, drawings and abstract is incorporated herein by reference in its entirety.

BACKGROUND

The present invention relates to a method of manufacturing a semiconductor device, in particular, to a technology effective when applied to a method of manufacturing a semiconductor device including a step of forming element isolation regions.

Element isolation regions are formed by making trenches in a semiconductor substrate and then filling these trenches with an insulating film. A semiconductor device is manufactured by forming various semiconductor elements in active regions defined by these element isolation regions. Active regions can be electrically isolated from each other by these element isolation regions.

Japanese Patent Laid-Open No. 2006-173260 (Patent Document 1) describes a technology of neutralizing a semiconductor substrate before wet etching treatment.

Japanese Patent Laid-Open No. 2008-113028 (Patent Document 2) describes a technology of attaching a substance, which has a more positive potential than the standard electrode potential of hydrogen, to a portion of a silicon surface, causing an oxidation reaction between HF and the silicon at the portion of the silicon surface to which the substance has been attached to form electron $e^-$, while blocking light to the silicon and thereby suppressing formation of an electron-hole pair in the silicon, and reacting the electron $e^-$ and a hydrogen ion $H^+$.

The technology described in Japanese Patent Laid-Open No. 2009-49293 (Patent Document 3) has a step (a) of forming a first insulating film 11 on a substrate 12, a step (c) of selectively removing the first insulating film 11 by wet etching, and a step (d) of forming a second insulating film 17 on a region of the substrate 12 from which the first insulating film 11 has been removed. In the step (c), the surface of the substrate 12 is irradiated with illumination light of visible light or infrared light during at least a period from when wet etching is started until the substrate is brought into contact with a chemical solution (symbols used here correspond to those used in Patent Document 3).

[Patent Document 1] Japanese Patent Laid-Open No. 2006-173260
[Patent Document 2] Japanese Patent Laid-Open No. 2008-113028
[Patent Document 3] Japanese Patent Laid-Open No. 2009-49293

SUMMARY

The following has been revealed as a result of investigation by the present inventors.

According to the investigation on the formation step of an element isolation region, it has been found that after the element isolation region is formed, the resulting semiconductor substrate is likely to have a pit (recess, hole) therein.

The element isolation region is formed by forming an oxide film on the main surface of a semiconductor substrate, forming a silicon nitride film on the oxide film, forming an element isolating trench in the silicon nitride film, the oxide film, and the semiconductor substrate, forming a silicon oxide film to fill the trench, removing the silicon oxide film outside the trench by CMP, while leaving the silicon oxide film in the trench, and then removing the silicon nitride film. In such a manner, an element isolation region made of a silicon oxide film buried in the trench is formed. Then, the oxide film on the main surface of the semiconductor substrate is removed by wet etching to expose the semiconductor substrate. It has been found that in such an element isolation region formation step, a pit is likely to occur in the semiconductor substrate at the time when the oxide film on the main surface of the semiconductor substrate is removed by wet etching to expose the semiconductor substrate.

When a pit is formed in a semiconductor substrate, there is a possibility of it deteriorating the reliability of semiconductor chips (semiconductor devices) obtained from semiconductor chip regions (regions of a semiconductor wafer from which semiconductor chips can be obtained later, respectively, are called "semiconductor chip regions") containing the pit. When semiconductor chips obtained from semiconductor chip regions containing a pit are selected and then removed, presence of such a pit deteriorates the production yield of a semiconductor device and becomes a cause for a cost rise.

An object of the invention is to provide a technology capable of providing a semiconductor device having improved reliability.

Another object of the invention is to provide a technology capable of improving the production yield of a semiconductor device.

The above and other objects and novel features of the invention will be apparent from the description herein and accompanying drawings.

Typical inventions, among the inventions disclosed herein, will next be outlined briefly.

A method of manufacturing a semiconductor device according to a typical embodiment includes the following steps: (a) preparing a semiconductor substrate, (b) forming a first insulating film on the main surface of the semiconductor substrate, (c) subjecting the first insulating film and the semiconductor substrate to plasma dry etching to form an element isolating trench in the first insulating film and the semiconductor substrate, and (d) forming a second insulating film on the main surface of the semiconductor substrate to fill the trench. The method further includes the following steps: (e) removing the second insulating film outside the trench by CMP to leave the second insulating film in the trench and (f) removing the first insulating film by wet etching to expose the semiconductor substrate. In the step (f), the first insulating film is wet etched while applying light of 140 lux or greater to at least a portion of the main surface of the semiconductor substrate.

A method of manufacturing a semiconductor device according to another typical embodiment includes the following steps: (a) preparing a semiconductor substrate, (b) forming a first insulating film on the main surface of the semiconductor substrate, (c) subjecting the first insulating film and the semiconductor substrate to plasma dry etching to form an element isolating trench in the first insulating film and the semiconductor substrate, and (d) forming a second insulating film on the main surface of the semiconductor substrate to fill the trench. The method further includes the following steps: (e) removing the second insulating film outside the trench by CMP to leave the second insulating film in the trench and (f) removing the first insulating film by wet etching to expose the semiconductor substrate. In the step (f), wet etching of the first insulating film is conducted while applying light to the main surface of the semiconductor substrate and after the step (f), when wet etching of the insulating film is carried out while having, on the main surface of the semiconductor substrate, the insulating film and a resist layer lying on the insulating film to expose the semiconductor substrate, the illuminance on the main surface of the semiconductor substrate is set lower than that on the main surface of the semiconductor substrate in the step (f).

Advantages available by typical inventions, among those described herein, will next be described briefly.

The typical embodiment makes it possible to provide a semiconductor device having improved reliability.

In addition, it can decrease a manufacturing cost of a semiconductor device.

DETAILED DESCRIPTION

Figure 1:
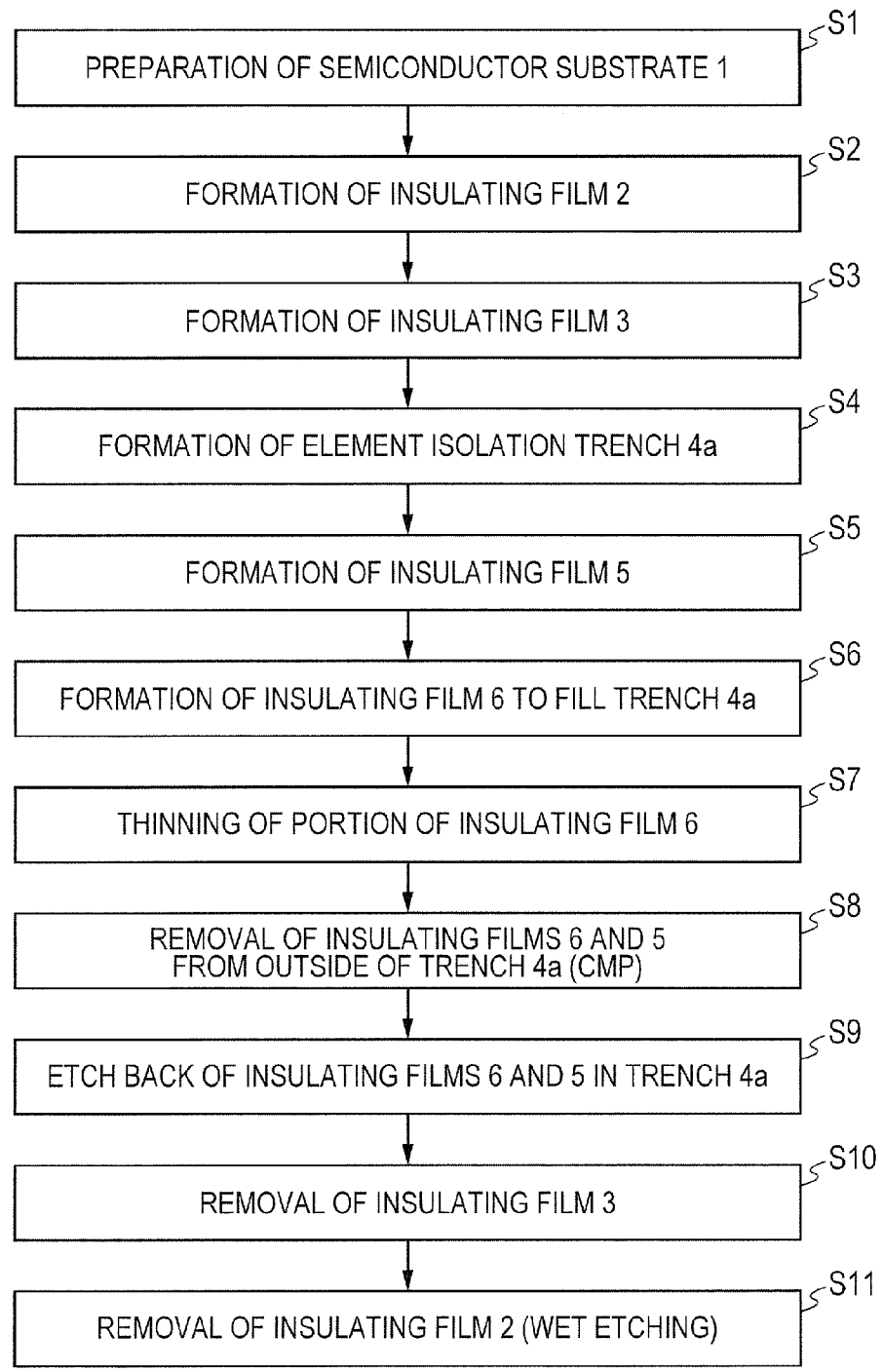
FIG. 1 is a flow chart of a manufacturing process showing some of manufacturing steps of a semiconductor device according to a first embodiment of the invention.

In the below-described embodiments, a description will be made after they are divided in plural sections or in plural embodiments if necessary for convenience's sake. These plural sections or embodiments are not independent each other, but in a relation such that one is a modification example, details, or complementary description of a part or whole of the other one unless otherwise specifically indicated. In the below-described embodiments, when a reference is made to the number of elements (including the number, value, amount, and range), the number of elements is not limited to a specific number but can be greater than or less than the specific number unless otherwise specifically indicated or principally apparent that the number is limited to the specific number. Moreover in the below-described embodiments, it is needless to say that the constituent elements (including element steps) are not always essential unless otherwise specifically indicated or principally apparent that they are essential. Similarly, in the below-described embodiments, when a reference is made to the shape, positional relationship, or the like of the constituent elements, that substantially analogous or similar to it is also embraced unless otherwise specifically indicated or different in principle. This also applies to the above-described value and range.

The embodiments of the invention will hereinafter be described in detail based on drawings. In all the drawings for describing the below-described embodiments, members having like function will be identified by like reference numerals and overlapping descriptions will be omitted. In addition, in the following embodiments, description on a portion similar to that described before is not repeated in principle.

In the drawings used in the embodiments, some cross-sectional views are not hatched in order to facilitate viewing of them. On the other hand, some plan views may be hatched to facilitate viewing of them.

<Manufacturing Steps of Semiconductor Device>

The manufacturing steps of a semiconductor device according to the present embodiment will next be described based on drawings. FIG. 1 is a flow chart of a manufacturing process showing some of the manufacturing steps of a semiconductor device according to the first embodiment of the invention, for example, a semiconductor device having a MISFET (Metal Insulator Semiconductor Field Effect Transistor). FIGS. 3 to 29 are fragmentary cross-sectional views showing the semiconductor device according to the first embodiment of the invention, for example, a semiconductor device having a MISFET.

Figure 3:
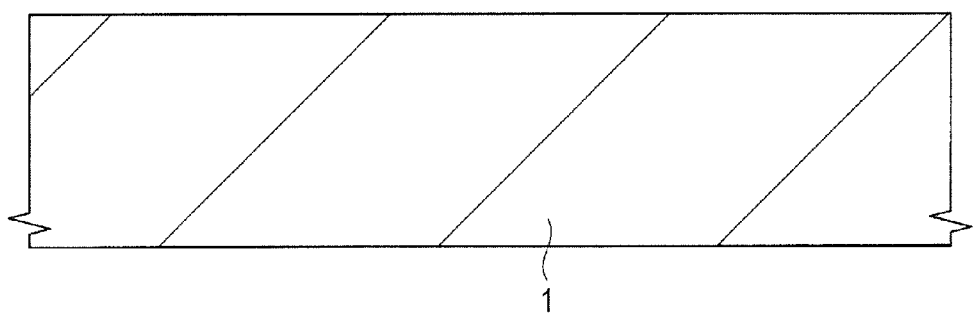
FIG. 3 is a fragmentary cross-sectional view of the semiconductor device during a manufacturing step thereof according to the first embodiment of the invention.
Figure 4:
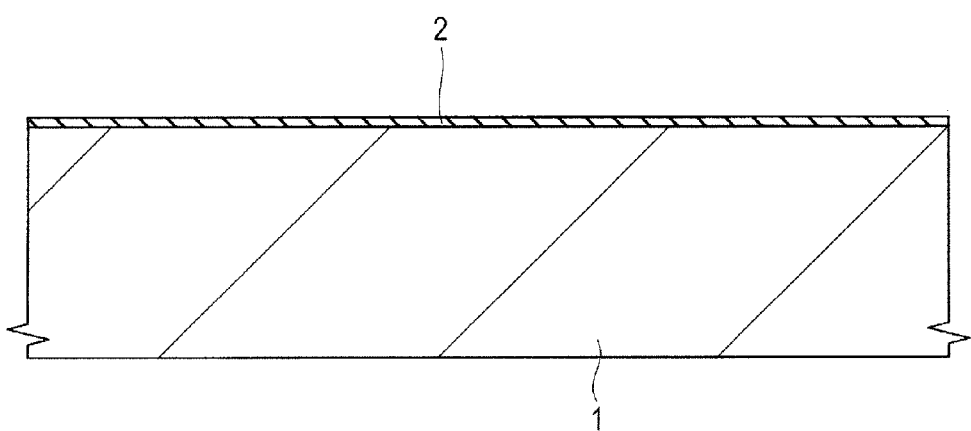
FIG. 4 is a fragmentary cross-sectional view showing the semiconductor device during a manufacturing step following that of FIG. 3.
Figure 5:
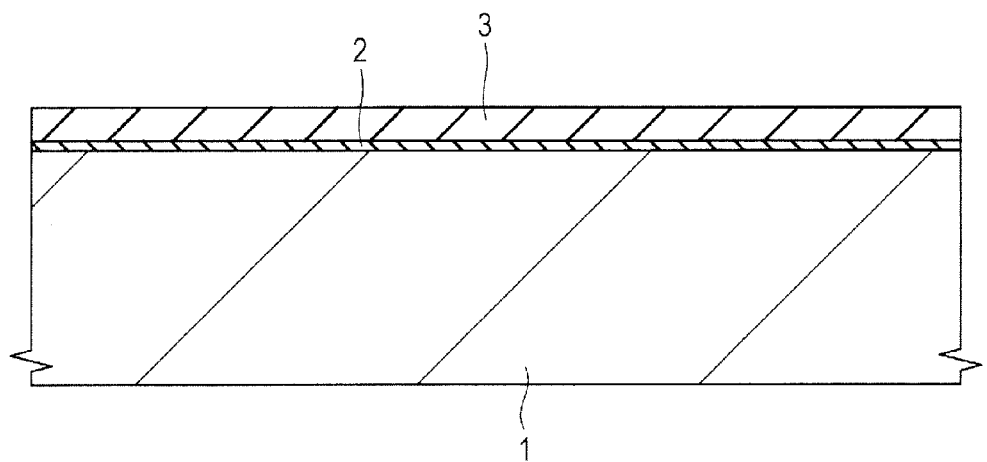
FIG. 5 is a fragmentary cross-sectional view showing the semiconductor device during a manufacturing step following that of FIG. 4.

First, as shown in FIG. 3, a semiconductor substrate (semiconductor wafer) 1 having, for example, a specific resistance of from about 1 to 10 Ωcm and made of p type single crystal silicon or the like is prepared (Step S1 of FIG. 1). Next, as shown in FIG. 4, the semiconductor substrate 1 is oxidized (preferably, thermally oxidized) to form an insulating film (oxide film) 2 on the surface (main surface) of the semiconductor substrate 1 (Step S2 of FIG. 1). Next, as shown in FIG. 5, an insulating film 3 is formed (deposited) on the mains surface (entire main surface) of the semiconductor substrate 1, that is, on the insulating film 2 by CVD (Chemical Vapor Deposition) (for example, thermal CVD) or the like (Step S3 of FIG. 1). The insulating film 2 is preferably made of a silicon oxide film and the insulating film 3 is preferably made of a silicon nitride film. The thickness of the insulating film 2 can be set at, for example, from about 5 to 20 nm, while that of the insulating film 3 is set at, for example, from about 100 to 500 nm.

Figure 6:
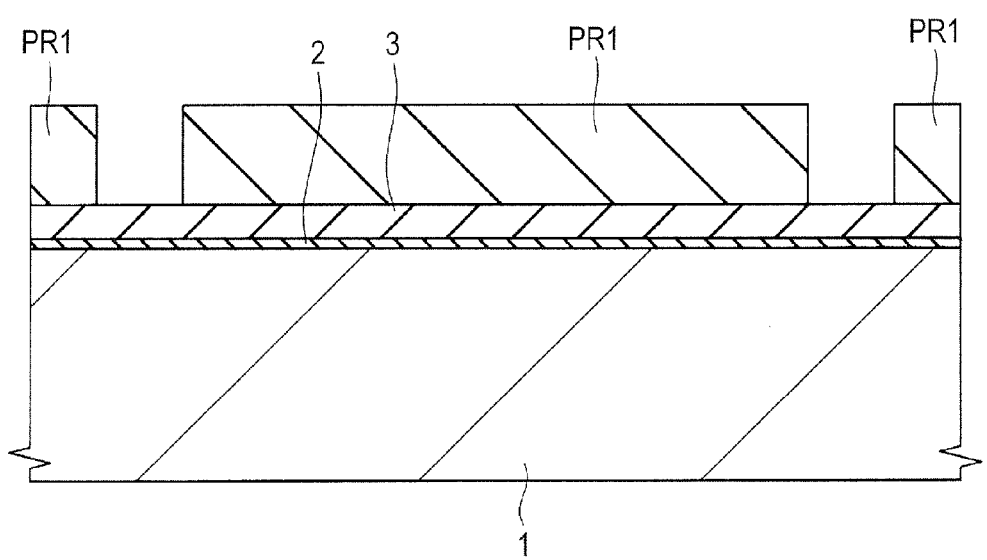
FIG. 6 is a fragmentary cross-sectional view showing the semiconductor device during a manufacturing step following that of FIG. 5.

Next, a photoresist layer is formed by application onto the main surface (entire main surface) of the semiconductor substrate 1, that is, onto the insulating film, followed by exposure and development of the resulting photoresist layer to form, as shown in FIG. 6, a photoresist pattern (resist pattern, resist layer, mask layer) PR1. The photoresist pattern PR1 has an opening portion in a region in which a trench 4a is to be formed later.

Figure 7:
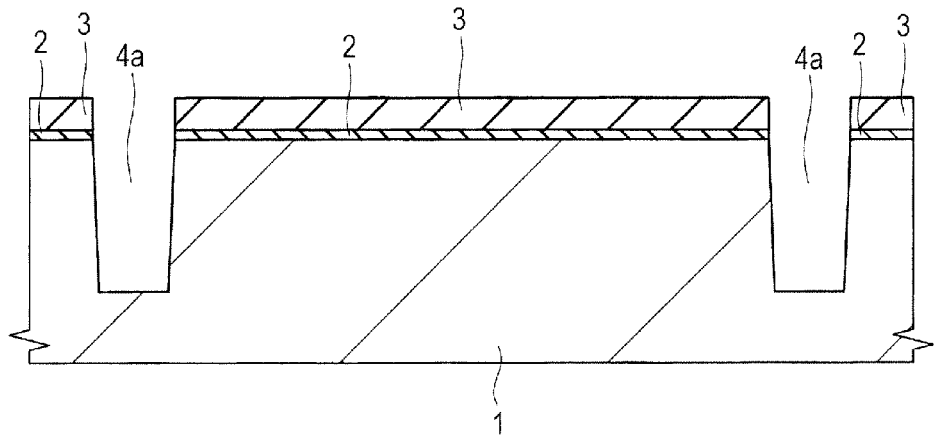
FIG. 7 is a fragmentary cross-sectional view showing the semiconductor device during a manufacturing step following that of FIG. 6.

Next, with the photoresist pattern PR1 as an etching mask, the insulating film 3, the insulating film 2, and the semiconductor substrate 1 are dry etched (plasma dry etched) successively to form a trench (element isolating trench) 4a as shown in FIG. 7 (Step S4 of FIG. 1). In this Step S4, the trench 4a is formed by plasma dry etching. The trench 4a extends across the insulating film 3, the insulating film 2, and the semiconductor substrate 1. More specifically, the trench 4a is formed in such a manner that it penetrates through the insulating film 3 and the insulating film 2 and has a bottom portion within the thickness of the semiconductor substrate 1. The depth of the trench 4a in the semiconductor substrate 1 (corresponding to the depth from the surface of the semiconductor substrate 1 to the bottom surface of the trench 4a) is, for example, from about 300 to 700 nm. The trench 4a is an element isolating trench. It is a trench for the formation of an element isolation region 4 which will be described later. After formation of the trench 4a, the photoresist pattern PR1 is removed. FIG. 7 shows the stage (state) after removal of the photoresist pattern PR1.

The term "plasma dry etching" as used herein means dry etching using plasma. This plasma dry etching includes etching induced mainly by radicals, etching induced mainly by ions, and etching induced by both radicals and ions. Plasma dry etching therefore includes not only plasma etching in which etching is induced mainly by radicals but also reactive ion etching (RIE) in which etching is induced mainly by ions.

Figure 8:
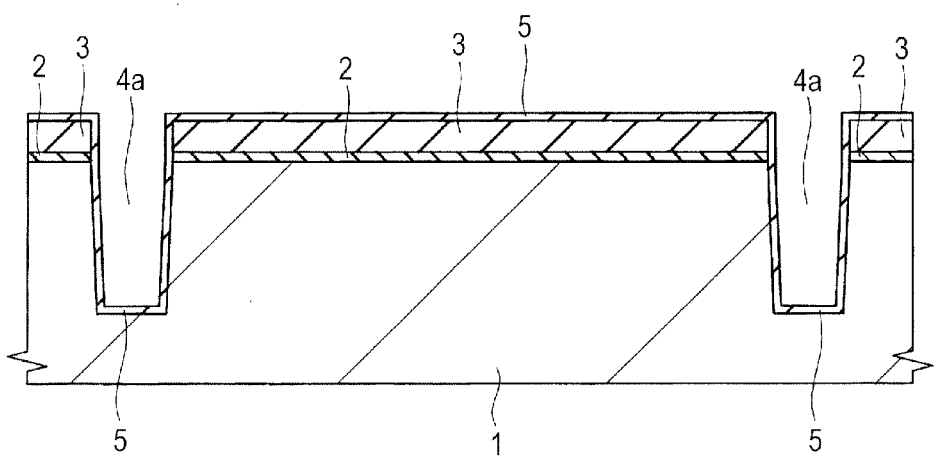
FIG. 8 is a fragmentary cross-sectional view showing the semiconductor device during a manufacturing step following that of FIG. 7.

Next, as shown in FIG. 8, an insulating film 5 is formed by oxidizing (preferably, thermally oxidizing) the inside (meaning the bottom surface and side walls of the trench 4a) of the trench 4a and the surface of the insulating film 3) (Step S5 of FIG. 1). The insulating film 5 is an oxide film and it is formed inside of the trench 4a (on the bottom surface and side walls of the trench 4a) and on the surface of the insulating film 3. A portion of the insulating film 5 formed on the surface of the semiconductor substrate 1 exposed from the bottom surface and side walls of the trench 4a is made of a silicon oxide film and the other portion formed on the surface of the insulating film 3 is made of a silicon oxide film or a silicon oxynitride film. The thickness of the insulating film 5 can be set at, for example, from about 5 to 20 nm.

Figure 9:
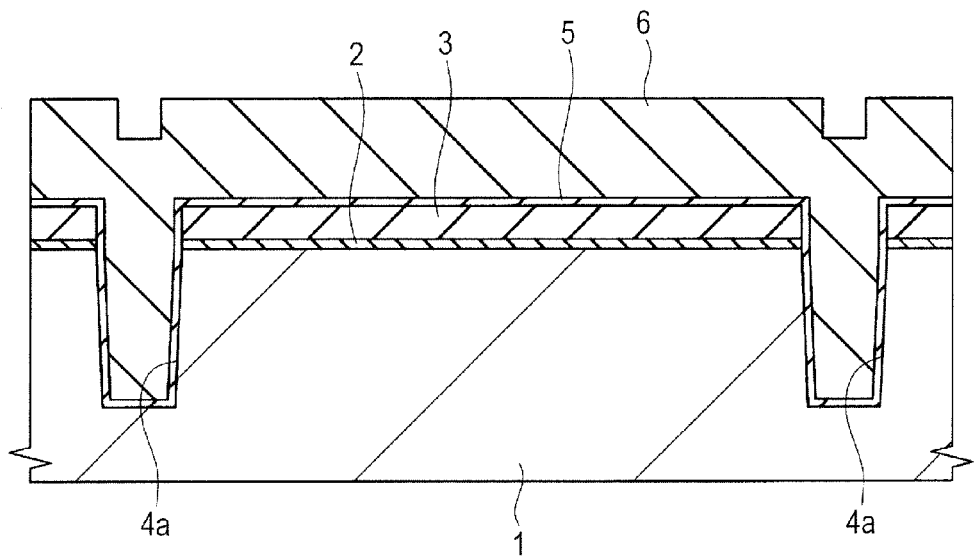
FIG. 9 is a fragmentary cross-sectional view showing the semiconductor device during a manufacturing step following that of FIG. 8.

Next, as shown in FIG. 9, an insulating film 6 is formed (deposited) on the main surface (entire main surface) of the semiconductor substrate 1, that is, on the insulating film so as to fill the trench 4a therewith (Step S6 of FIG. 1). The insulating film 6 is preferably made of a silicon oxide film. The insulating film 6 is formed preferably by plasma CVD, particularly preferably by HDP (High Density Plasma)-CVD. The insulating film 6 has a thickness enough to fill the trench 4a therewith. Although depending on the depth of the trench 4a, the thickness of the insulating film 6 can be set at from about 500 to 1000 nm. When the insulating film 6 is formed by plasma CVD (particularly, HDP-CVD), the insulating film 5 has an effect of preventing the damage to the semiconductor substrate 1 when the insulating film 6 is deposited. After formation of the insulating film 6, cleaning such as scrubber cleaning (for example, scrubber cleaning with pure water) is performed.

Next, heat treatment (annealing) is performed to bake the insulating film 6 buried in the trench 4a. This heat treatment can be performed by heat treating the semiconductor substrate 1 at, for example, from 400 to 1200° C.

Figure 10:
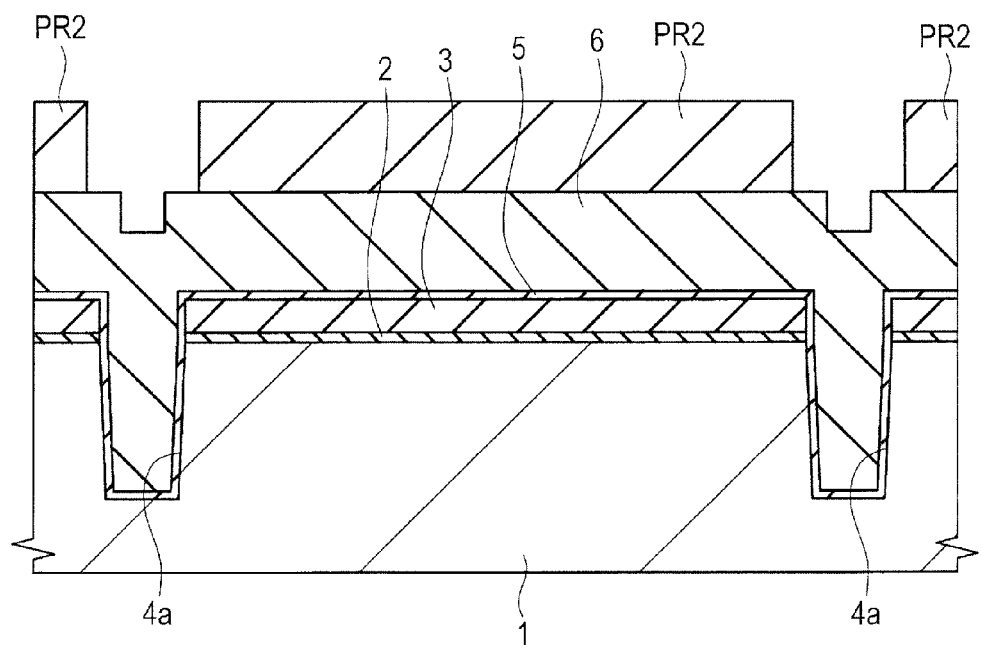
FIG. 10 is a fragmentary cross-sectional view showing the semiconductor device during a manufacturing step following that of FIG. 9.

Next, a photoresist layer is formed by application on the main surface (entire main surface) of the semiconductor substrate 1, that is, on the insulating film 6, followed by exposure and development of the photoresist layer to form a photoresist pattern (resist pattern, resist layer, mask layer) PR2 as shown in FIG. 10. The photoresist pattern PR2 has, in a planar view, a pattern shape that covers the trench 4a (meaning that it overlaps with the trench 4a) and exposes a region in which no trench 4a has been formed.

Figure 11:
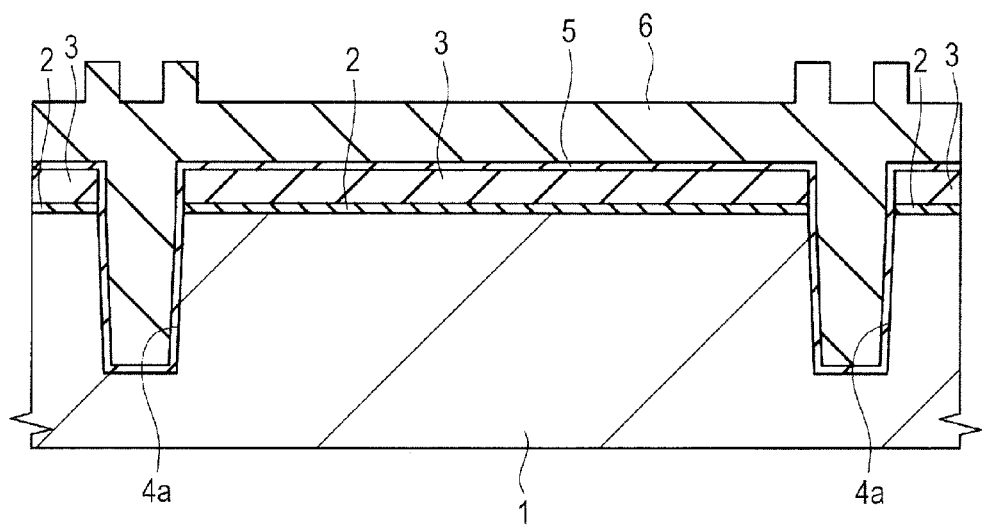
FIG. 11 is a fragmentary cross-sectional view showing the semiconductor device during a manufacturing step following that of FIG. 10.

Next, with the photoresist pattern PR2 as an etching mask, the insulating film 6 is dry etched (plasma dry etched). A portion of the insulating film 6 (that is, a portion of the insulating film 6 in a region, in a planar view, not overlapping with the trench 4a) exposed from the photoresist pattern PR2 is etched back to decrease its thickness (Step S7 of FIG. 1). In this Step S7, plasma dry etching is preferably used. Then, the photoresist pattern PR2 is removed by ashing (plasma ashing) or the like, followed by cleaning treatment (for example, cleaning treatment with pure water). FIG. 11 shows the stage (state) after removal of the photoresist pattern PR2. Step S7 is conducted in order to suppress or prevent dishing or the like caused by CMP in Step S8 which will be conducted later, but Step S7 can be omitted, if such a defect can be neglected.

Figure 12:
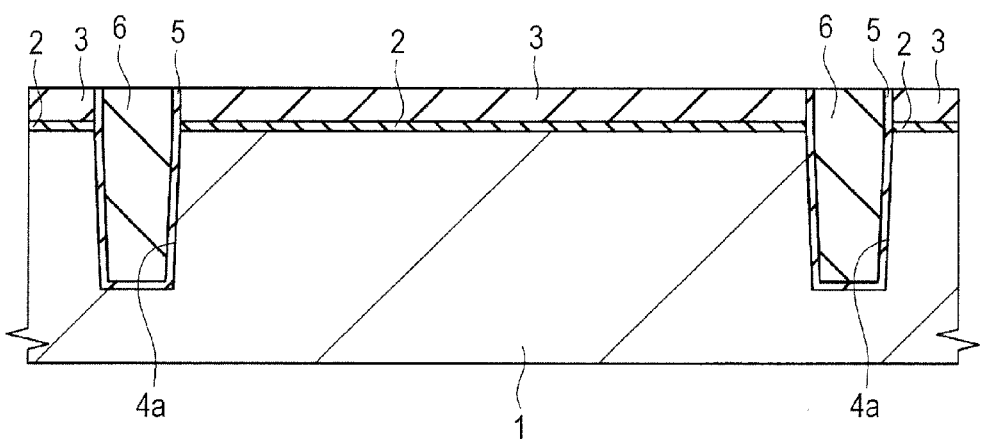
FIG. 12 is a fragmentary cross-sectional view showing the semiconductor device during a manufacturing step following that of FIG. 11.

Next, the insulating film 6 is polished using CMP (Chemical Mechanical Polishing) (Step S8 of FIG. 1). By this polishing, the insulating film 6 outside the trench 4a is removed as shown in FIG. 12 and the insulating film 6 is left in the trench 4a. By this CMP, the insulating film 5 on the insulating film 3 is also removed and the upper surface of the insulating film 3 is exposed. This CMP in Step S8 is conducted under such conditions that the polishing rate of the insulating film 3 (silicon nitride film) is made smaller than that of the insulating films 6 and 5 (silicon oxide films) so that the insulating film 3 can function as a stopper film (or protecting film) for CMP.

Figure 13:
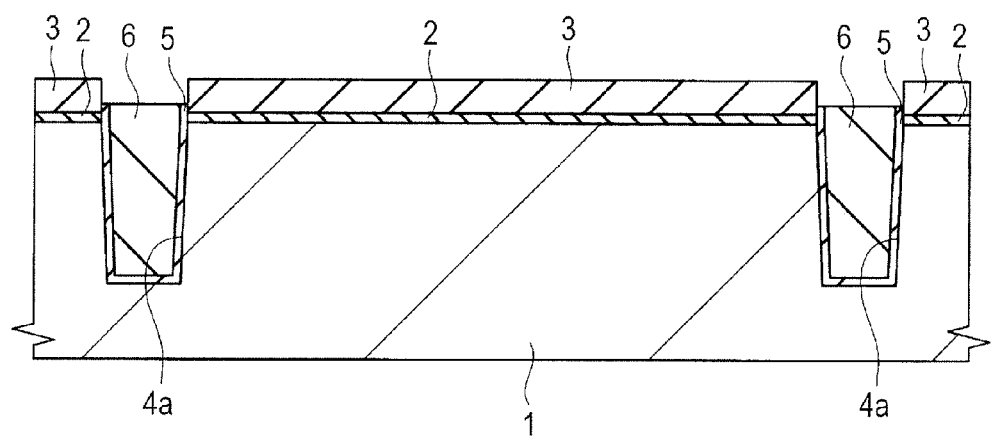
FIG. 13 is a fragmentary cross-sectional view showing the semiconductor device during a manufacturing step following that of FIG. 12.

As illustrated in FIG. 13, the upper portion (upper surface) of the insulating film 6 in the trench 4a is etched back by dry etching (plasma dry etching) to retreat the upper surface of the insulating film 6 in the trench 4a (Step S9 of FIG. 1). In this Step S9, plasma dry etching is preferably used. It is conducted under such etching conditions that the etching rate of the insulating film 3 (silicon nitride film) is made smaller than that of the insulating film 6 (silicon oxide film). After this etching, the height position of the upper surface of the insulating film 6 in the trench 4a becomes lower than that of the upper surface of the insulating film 3, though before Step S9 (and after Step S8), the height position of the upper surface of the insulating film 6 in the trench 4a is almost equal to that of the upper surface of the insulating film 3. It is however preferred to complete dry etching (plasma dry etching) of Step S9 before the height position of the upper surface of the insulating film 6 in the trench 4a becomes lower than that of the interface between the semiconductor substrate 1 and the insulating film 2. FIG. 13 shows the case where the height position of the upper surface of the insulating film 6 in the trench 4a is located between the height position of the upper surface of the insulating film 2 and the height position of the upper surface of the insulating film 3.

Figure 14:
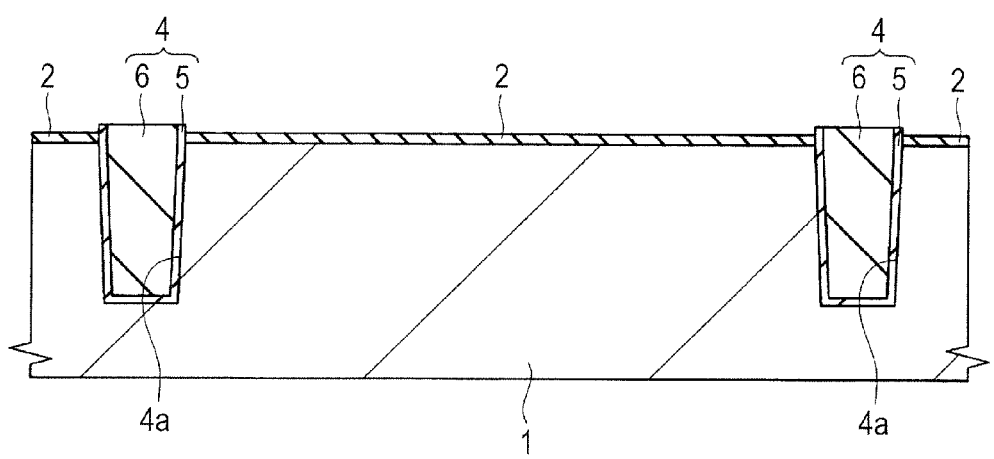
FIG. 14 is a fragmentary cross-sectional view showing the semiconductor device during a manufacturing step following that of FIG. 13.

Next, as shown in FIG. 14, the insulting film 3 is removed by wet etching with a chemical solution (etching solution) such as hot phosphoric acid (Step S10 of FIG. 1). This wet etching is conducted under such etching conditions that the etching rate of the insulating films 6, 5, and 2 (silicon oxide films) is made smaller than that of the insulating film 3 (silicon nitride film). In this Step S10, the insulating film 3 is selectively removed to expose the upper surface of the insulating film 2.

Figure 15:
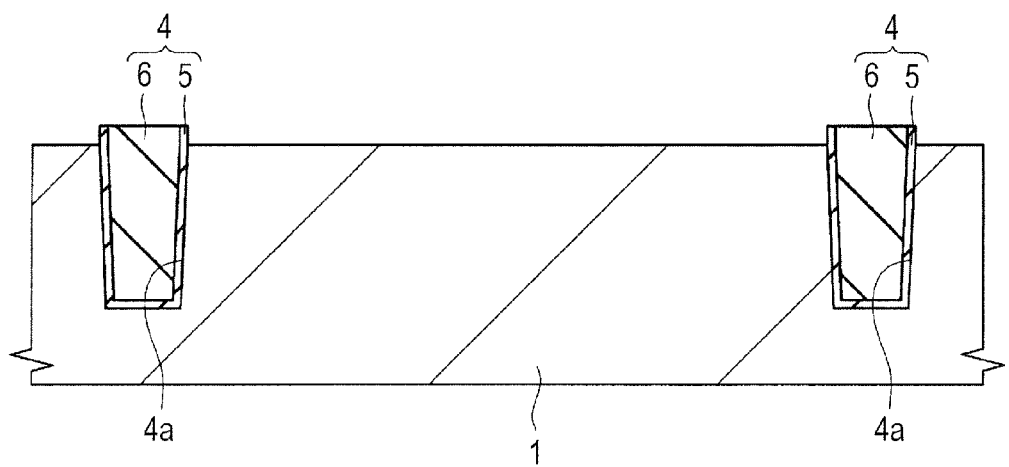
FIG. 15 is a fragmentary cross-sectional view showing the semiconductor device during a manufacturing step following that of FIG. 14.

Next, as shown in FIG. 15, the insulating film 2 is removed by wet etching with a chemical solution (etching solution) such as hydrofluoric acid (Step S11 of FIG. 1). By removing the insulating film 2, the upper surface (surface, Si surface) of the semiconductor substrate 1 is exposed. This means that in Step S11, the insulating film 2 is removed by wet etching to expose the Si surface of the semiconductor substrate 1. In addition, the wet etching in Step S11 is conducted only for removing the insulating film 2 and exposing the upper surface of the semiconductor substrate 1 so that most of the insulating films 6 and 5 in the trench 4a remain without being etched. With the insulating film 5 and the insulating film 6 in the trench 4a, an element isolation region (element isolation) 4 is formed.

It is also possible to regard the insulating film 5 and the insulating film 6 just before Step S11 as the element isolation region 4, but in this case, the element isolation region 4 obtained by slightly etching the upper surface of these insulating films just before Step S11 becomes the element isolation region 4 after Step S11.

In Step S11, wet etching of the insulating film 2 is conducted without a resist layer (photoresist layer) on the main surface (on the insulating film 2) of the semiconductor substrate 1 so that the insulating film 2 on the entire main surface of the semiconductor substrate 1 is removed by etching. When Step S11 is conducted, therefore, the surface (Si surface) of the semiconductor substrate 1 in a region (that is, an active region) other than the region where the element isolation region 4 has been formed is exposed. The removing step (wet etching step) of the insulating film 2 in Step S11 will be described later in detail.

In such a manner, the element isolation region 4 made of the insulating films 5 and 6 buried in the trench 4a of the semiconductor substrate 1 is formed. Since the insulating film 5 is thinner than the insulating film 6, the element isolation region 4 is comprised mainly of the insulating film 6 buried in the trench 4a. Thus, the element isolation region 4 is formed using STI (Shallow Trench Isolation). Since the element isolation region 4 is formed, an active region is defined (partitioned) by the element isolation region 4 in the semiconductor substrate 1. In this active region, various semiconductor elements (for example, MISFETs Q1 and Q2 which will be described later) will be formed in subsequent steps.

Figure 2:
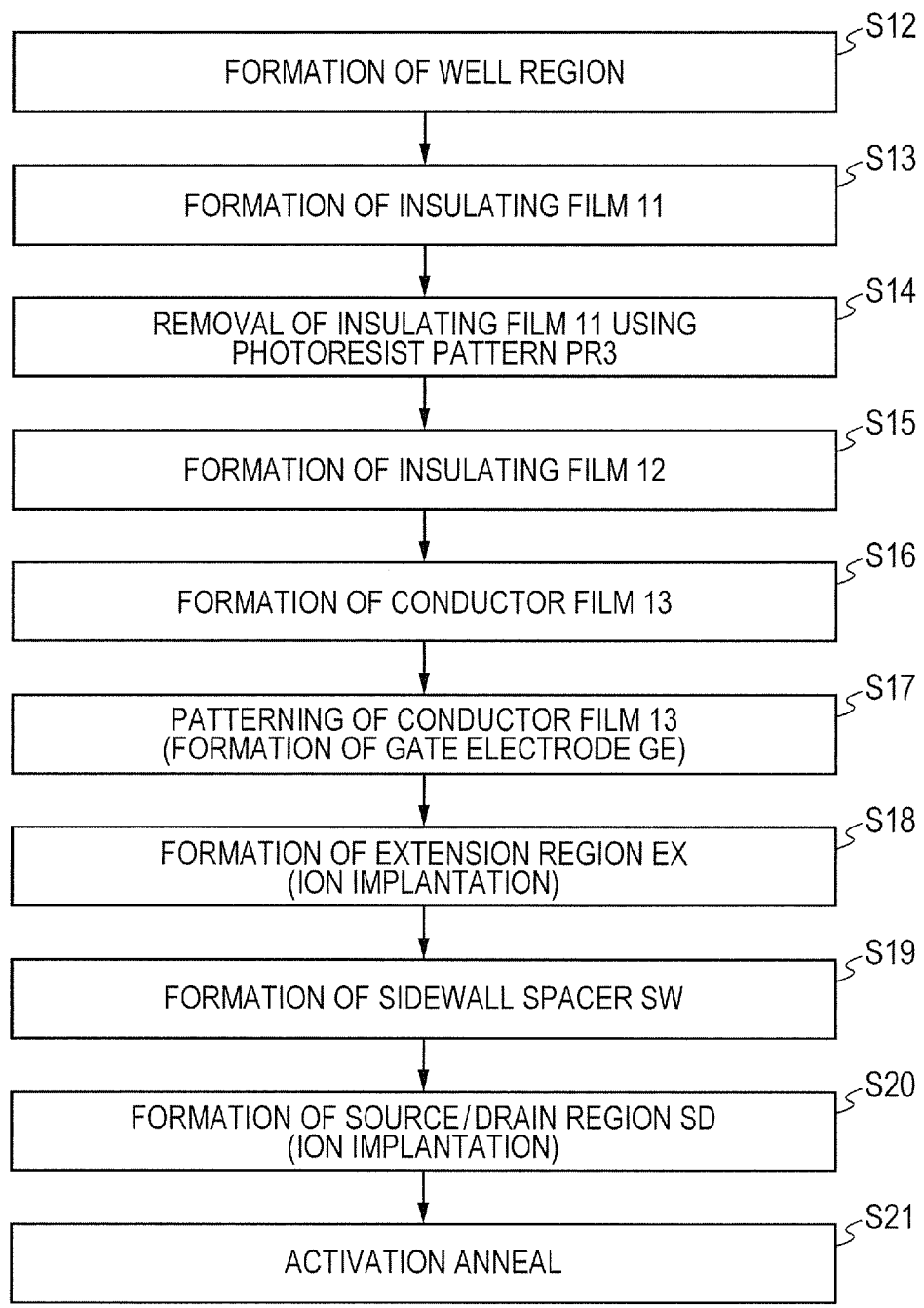
FIG. 2 is a flow chart of the manufacturing process showing some of manufacturing steps of the semiconductor device according to the first embodiment of the invention.
Figure 16:
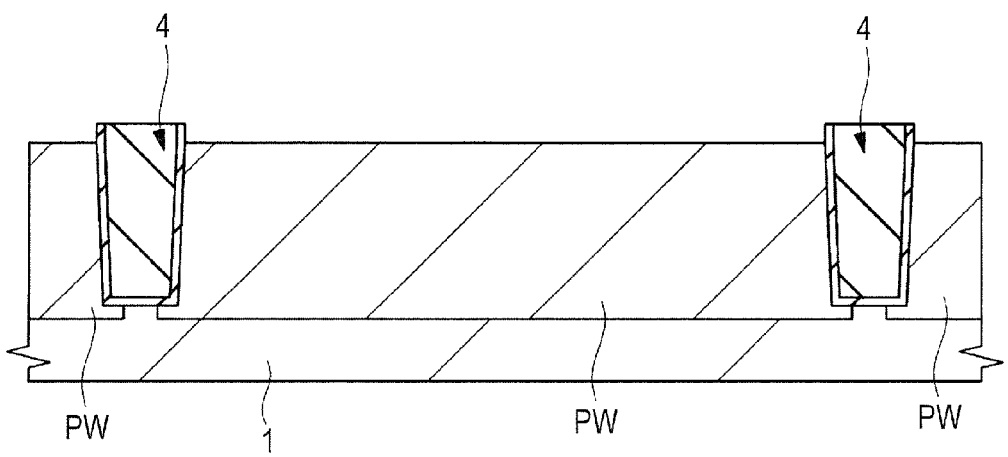
FIG. 16 is a fragmentary cross-sectional view showing the semiconductor device during a manufacturing step following that of FIG. 15.

Next, as shown in FIG. 16, a well region extending to a predetermined depth from the main surface of the semiconductor substrate 1 is formed (Step S12 of FIG. 2). In this embodiment, a description will be made on the formation of, as the MISFET, an n channel MISFET so that a p well (p type well region) PW is formed as the well region. The p well PW can be formed by ion implantation of p type impurities such as boron (B) in the semiconductor substrate 1. When a p channel MISFET is formed, on the other hand, an n type well region (n well) is formed by ion implantation of n type impurities such as phosphorus (P) or arsenic (As) in the semiconductor substrate 1.

Figure 17:
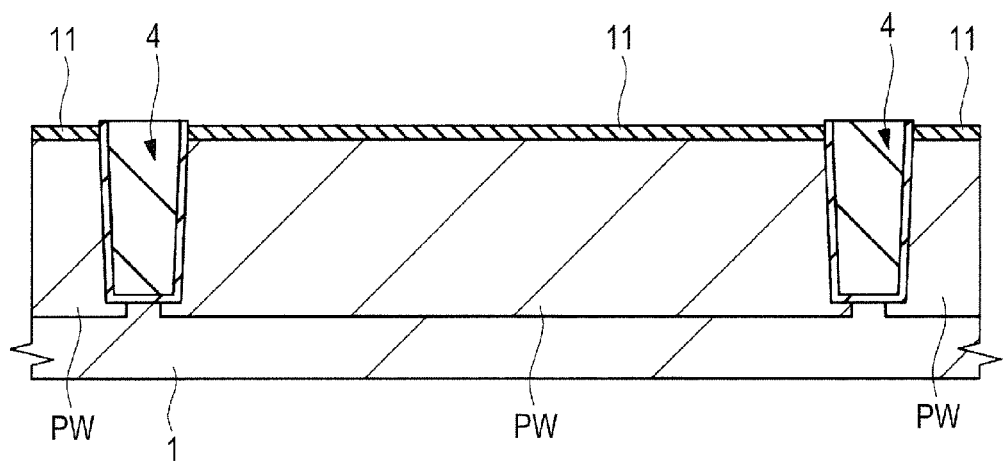
FIG. 17 is a fragmentary cross-sectional view showing the semiconductor device during a manufacturing step following that of FIG. 16.

Next, as shown in FIG. 17, an insulating film 11 for a gate insulating film of the MISFET is formed on the surface (that is, the surface of the P well PW) of the semiconductor substrate 1 (Step S13 of FIG. 2). The insulating film 11 is made of, for example, a thin silicon oxide film and can be formed, for example, by thermal oxidation.

Figure 18:
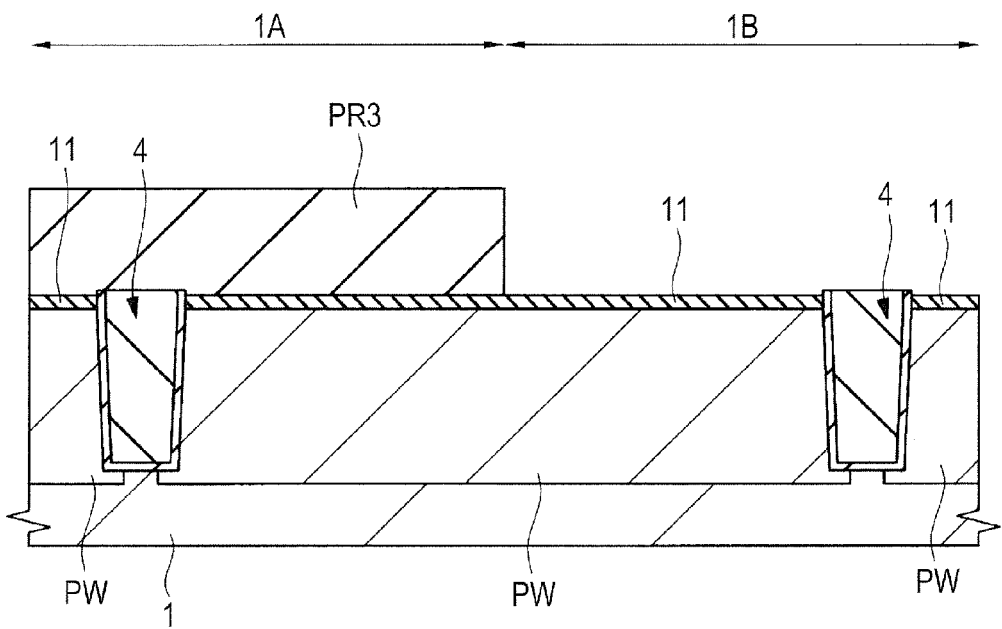
FIG. 18 is a fragmentary cross-sectional view showing the semiconductor device during a manufacturing step following that of FIG. 17.

Next, a photoresist layer is formed by application onto the main surface (entire main surface) of the semiconductor substrate 1, that is, onto the insulating film 11, followed by exposure and development of this photoresist layer to form a photoresist pattern (resist pattern, resist layer, mask layer) PR3 as shown in FIG. 18.

Figure 19:
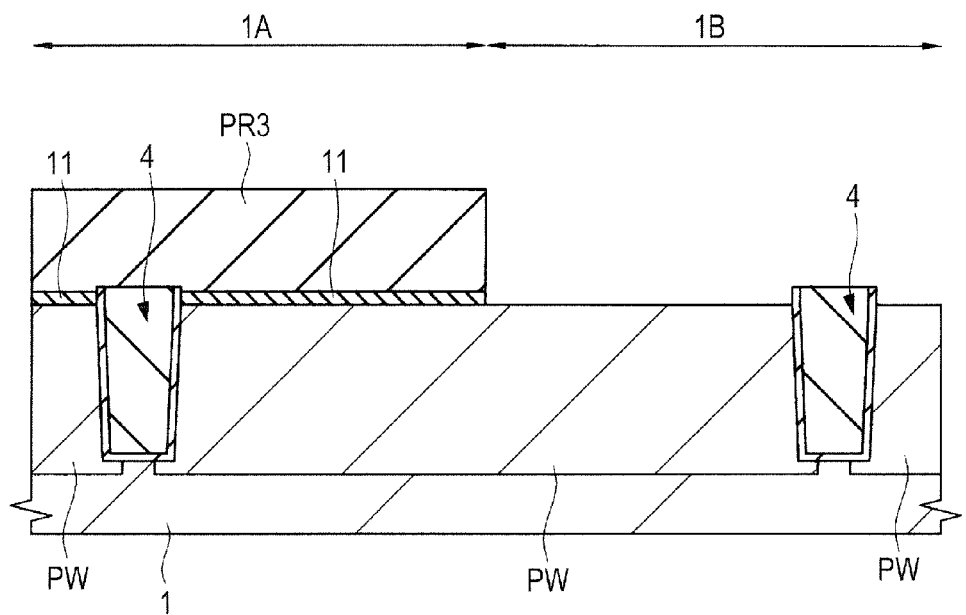
FIG. 19 is a fragmentary cross-sectional view showing the semiconductor device during a manufacturing step following that of FIG. 18.

Next, as shown in FIG. 19, with the photoresist pattern PR3 as an etching mask, the insulating film 11 is etched to selectively remove a portion of the insulating film 11 exposed from the photoresist pattern PR3 (Step S14 of FIG. 2). In this etching, a portion of the insulating film 11 covered with the photoresist pattern PR3 remains without being removed. For the etching in Step S14, wet etching using, as a chemical solution (etching solution), hydrofluoric acid or the like can be employed. In a region from which the insulating film 11 has been removed, the upper surface (surface, Si surface) of the semiconductor substrate 1 is exposed.

In a region where a high breakdown voltage MISFET is to be formed (which will hereinafter be called "high breakdown voltage MIS region 1A"), the insulating film 11 remains, while in a region where a low breakdown voltage MISFET is to be formed (which will hereinafter be called "low breakdown voltage MIS region 1B), the insulating film 11 is removed to expose the upper surface (Si surface) of the semiconductor substrate 1. This means that the photoresist pattern PR3 has a pattern which covers, in a planar view, the high breakdown voltage MIS region 1A and exposes the low breakdown voltage MIS region 1B. It is also possible to improve wettability (improve wettability with the photoresist pattern PR3) upon wet etching by subjecting the photoresist pattern PR3 to surface treatment (plasma surface treatment), for example, plasma treatment with an asher prior to wet etching (that is, Step S14) of the insulating film 11 through the photoresist pattern PR3.

Figure 20:
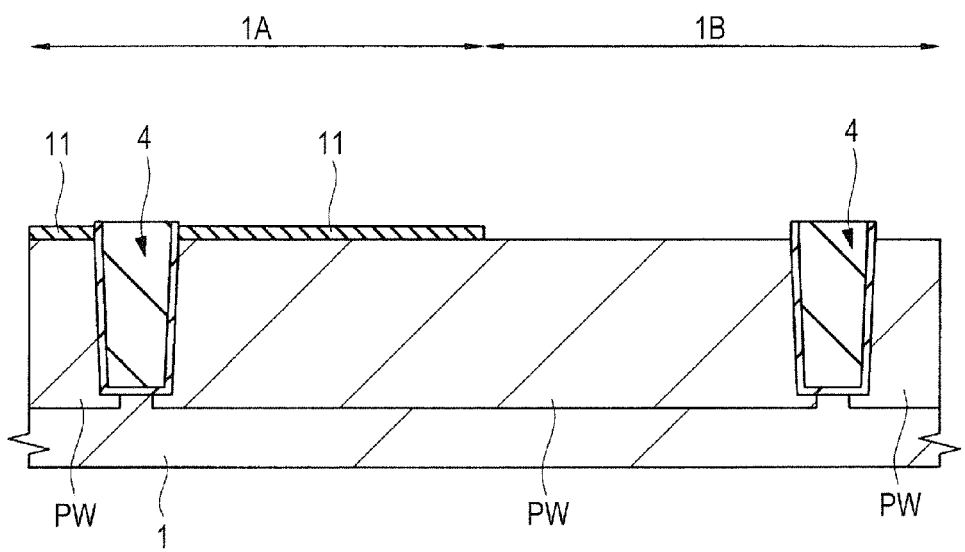
FIG. 20 is a fragmentary cross-sectional view showing the semiconductor device during a manufacturing step following that of FIG. 19.

Next, as shown in FIG. 20, the photoresist pattern PR3 is removed. For the removal of the photoresist pattern PR3, wet treatment can be used. For example, SPM cleaning with a solution of SPM (Sulfuric acid-Hydrogen Peroxide Mixture) can be employed.

Figure 21:
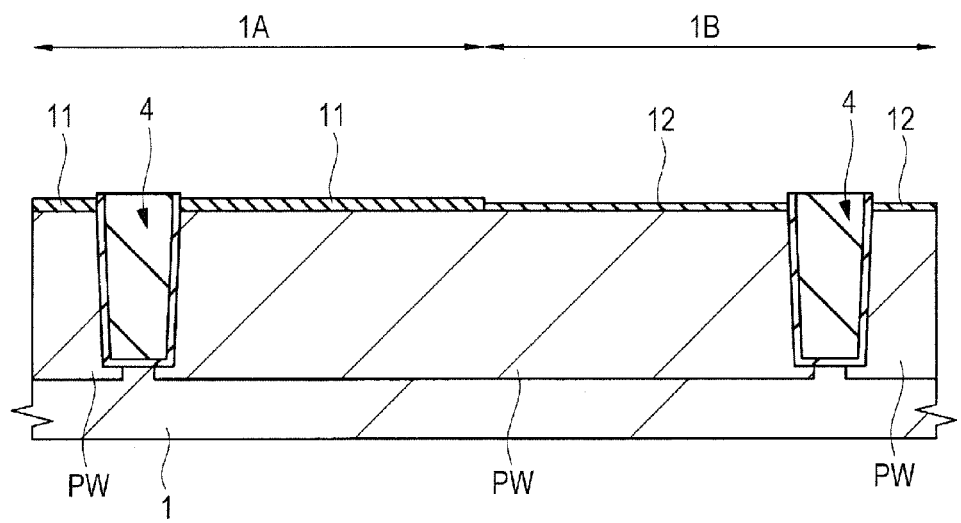
FIG. 21 is a fragmentary cross-sectional view showing the semiconductor device during a manufacturing step following that of FIG. 20.

Next, on the surface (that is, the surface of the p well PW) of the semiconductor substrate 1 in a region (that is, low breakdown voltage MIS region 1B) from which the insulating film 11 has been removed in the wet etching step (step of wet etching the insulating film 11 with the photoresist pattern PR3 as an etching mask) of Step S14, an insulating film 12 for a gate insulating film of the MISFET is formed by oxidation (for example, thermal oxidation) as shown in FIG. 21 (Step S15 of FIG. 2). The insulating film 12 is made of, for example, a thin silicon oxide film. Formation of the insulating film 12 sometimes increases the thickness of the insulating film 11.

When the insulating film 12 is formed in Step S15 (the stage shown in FIG. 21), it is necessary to control the thickness of the insulating film 11 and the insulating film 12 at the time of formation so as to make the thickness of the insulating film 12 smaller than that of the insulating film 11. To achieve this, it is only necessary to make the thickness of the insulating film 11 at the time when the insulating film 11 is formed in Step S13 (the stage shown in FIG. 17) greater than that of the insulating film 12 at the time when the insulating film 12 is formed in Step S15 (the stage shown in FIG. 21), but the thickness of the insulating film 11 sometimes becomes greater when the insulating film 12 is formed (preferably, by thermal oxidation).

Thus, as shown in FIG. 21, the insulating film 12 is formed on the surface of the semiconductor substrate 1 (p well PW) in the low breakdown voltage MIS region 1B and the insulating film 11 thicker than the insulating film 12 is formed on the surface of the semiconductor substrate 1 (p well PW) in the high breakdown voltage MIS region 1A.

Figure 22:
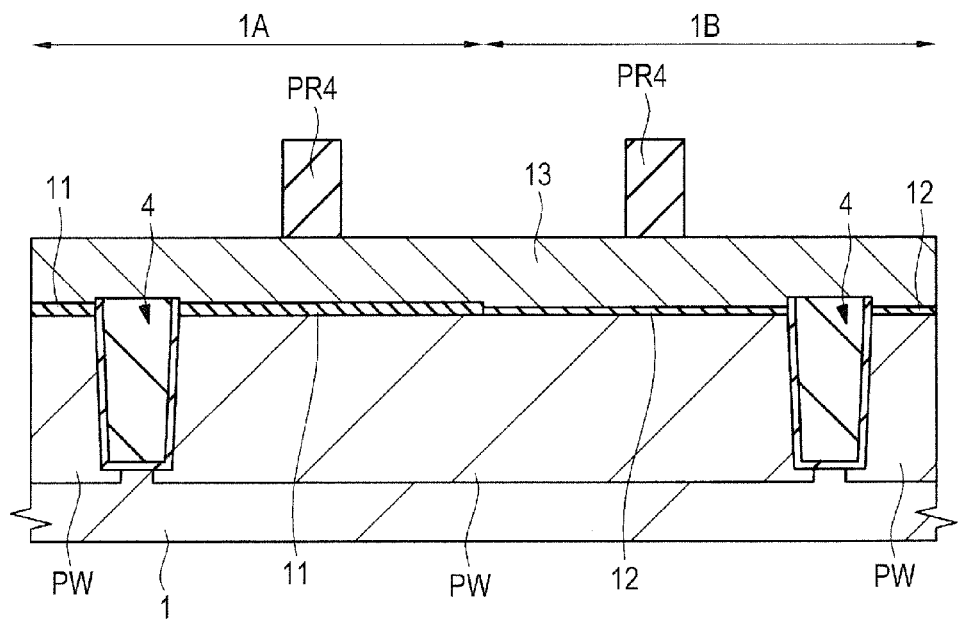
FIG. 22 is a fragmentary cross-sectional view showing the semiconductor device during a manufacturing step following that of FIG. 21.
Figure 23:
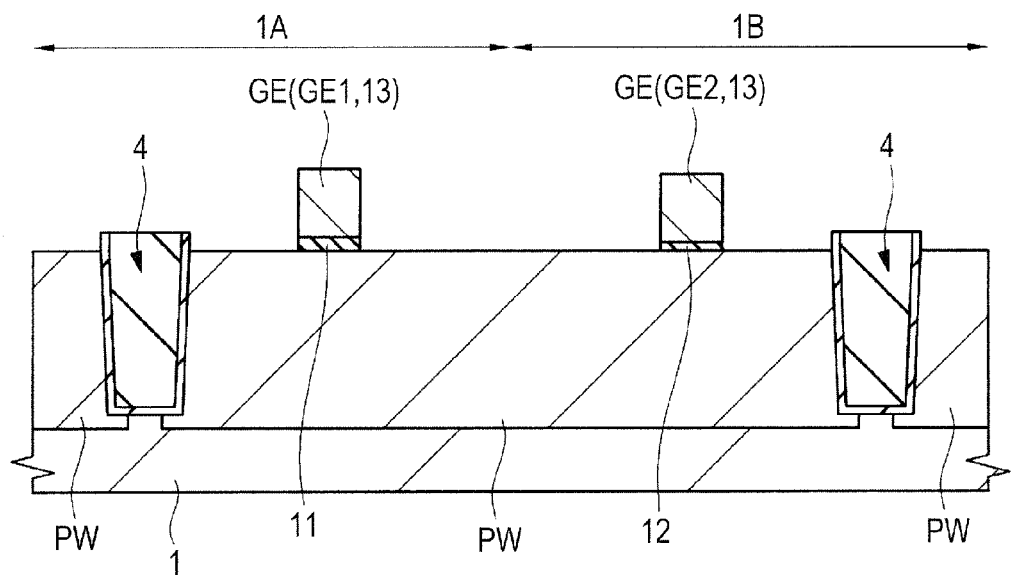
FIG. 23 is a fragmentary cross-sectional view showing the semiconductor device during a manufacturing step following that of FIG. 22.

Next, as shown in FIG. 22, a conductor film 13 for gate electrode is formed on the main surface (entire main surface) of the semiconductor substrate 1 (Step S16 of FIG. 2). The conductor film 13 may be, for example, a polycrystalline silicon film (doped polysilicon film). Then, a photoresist layer is formed by application on the main surface (entire main surface) of the semiconductor substrate 1, that is, on the conductor film 13, followed by exposure and development of this photoresist layer to form a photoresist pattern (resist pattern, resist layer, mask layer) PR4. By dry etching (plasma dry etching) with the photoresist pattern PR4 as an etching mask, the conductor film 13 is patterned by etching to form a gate electrode GE made of the patterned conductor film 13 as shown in FIG. 23 (Step S17 of FIG. 2). Of the gate electrodes GE, a gate electrode GE1 for high breakdown voltage MISFET is formed on the semiconductor substrate 1 (p well PW) via the insulating film 11 and a gate electrode GE2 for low breakdown voltage MISFET is formed on the semiconductor substrate 1 (p well PW) via the insulating film 12. Then, the photoresist pattern PR4 is removed. FIG. 23 shows the stage (state) after removal of the photoresist pattern PR4. The insulating film 11 remains under the gate electrode GE1 and the insulating film 12 remains under the gate electrode GE2. The insulating films 11 and 12 sometimes remain as layers in a region not covered with the gate electrodes GE1 and GE2.

Figure 24:
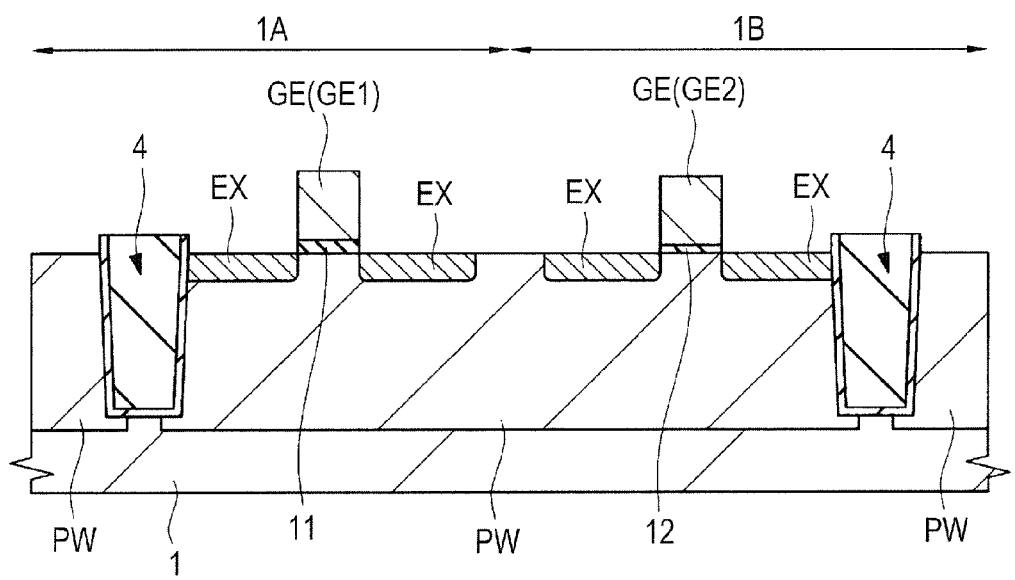
FIG. 24 is a fragmentary cross-sectional view showing the semiconductor device during a manufacturing step following that of FIG. 23.

Next, as shown in FIG. 24, n type impurities such as phosphorus (P) or arsenic (As) are ion-implanted in regions of the p well PW on both sides of the gate electrode GE to form n type extension regions (n⁻ type semiconductor regions) EX (Step S18 of FIG. 2). These extension regions EX are n type semiconductor regions. When ion implantation is conducted, the gate electrode GE can function as an ion implantation inhibiting mask so that impurities are not ion-implanted in a region of the P well PW rightly below the gate electrode GE and the extension regions EX are formed in alignment (self alignment) with the sidewall of the gate electrode GE.

Figure 25:
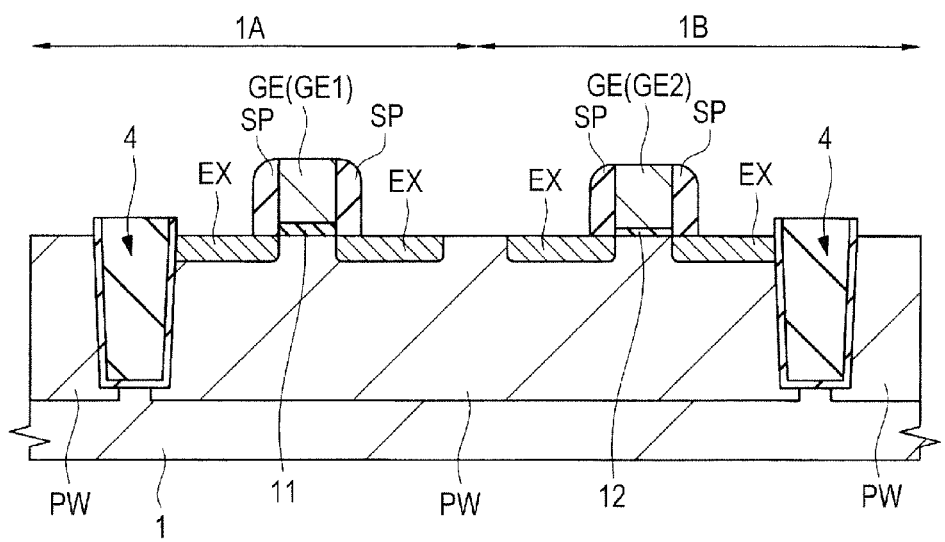
FIG. 25 is a fragmentary cross-sectional view showing the semiconductor device during a manufacturing step following that of FIG. 24.

Next, as shown in FIG. 25, a sidewall spacer (side wall spacer, side wall insulating film, sidewall) SP made of a silicon oxide film, a silicon nitride film, or a film stack of these insulating films is formed on the sidewall of the gate electrode GE as a side wall insulating film (insulating film) (Step S19 of FIG. 2). The sidewall spacer SP can be formed by depositing a silicon oxide film or a silicon nitride film, or a film stack thereof on the main surface (entire main surface) of the semiconductor substrate 1 and then, anisotropically etching the resulting silicon oxide film, silicon nitride film, or the film stack by RIE (Reactive Ion Etching).

Figure 26:
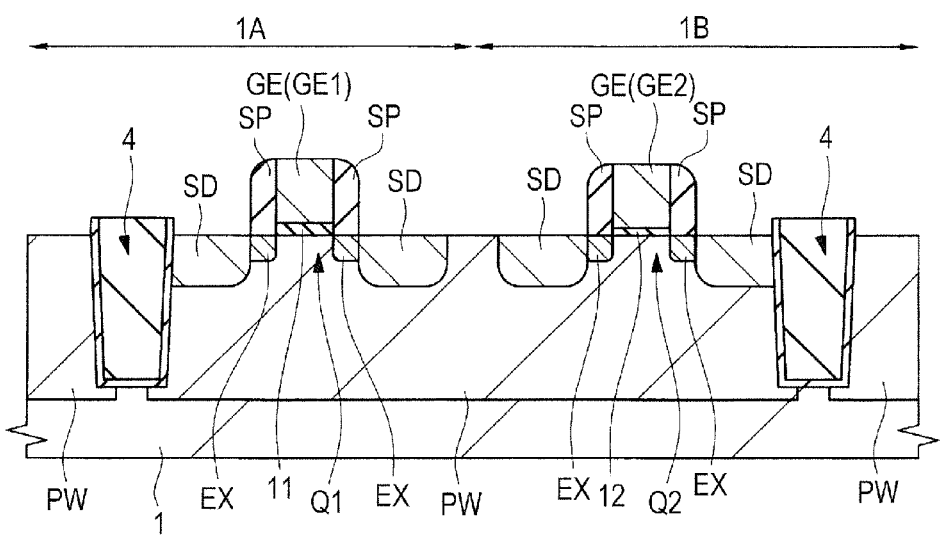
FIG. 26 is a fragmentary cross-sectional view showing the semiconductor device during a manufacturing step following that of FIG. 25.

After formation of the sidewall spacer SP, n type impurities such as phosphorus (P) or arsenic (As) are ion-implanted in a region of the p well PW on both sides of the gate electrode GE and the sidewall spacer SP to form n type source/drain regions (n⁺ type semiconductor regions) SD as shown in FIG. 26 (Step S20 of FIG. 2). The source/drain regions SD are n type semiconductor regions. At the time of this ion implantation, the gate electrode GE and the sidewall spacer SP on the sidewall thereof can function as an ion implantation inhibiting mask so that impurities are not introduced (ion implanted) in regions of the p well PW just under the gate electrode GE and just under the sidewall spacer SP on the side wall of the gate electrode GE. The source/drain regions SD are therefore formed in alignment (self alignment) with the side surface of the sidewall spacer SP (surface on the side opposite to the side in contact with the gate electrode GE) on the side wall of the gate electrode GE.

After ion implantation for forming the source/drain regions SD, annealing is conducted to activate the impurities thus introduced (Step S21 of FIG. 2). This annealing can be conducted, for example, by flash lamp annealing at 1050° C.

By a pair of the extension regions EX and the source/drain regions SD formed for the same MISFET (for the same gate electrode GE), n type semiconductor regions functioning as a source or drain of the LDD (Lightly doped Drain) structure of the n channel MISFET are formed. With regard to the relationship between the extension regions EX and the source/drain regions SD formed for the same MISFET (the same gate electrode GE), the extension regions EX are inserted between the source/drain regions SD and a channel region (a region rightly below the gate electrode GE) and the source/drain regions SD have a higher impurity concentration and a greater depth (junction depth) than the extension regions EX.

Thus, as shown in FIG. 26, n channel MISFETs (Metal Insulator Semiconductor Field Effect Transistors) Q1 and Q2 are formed in the p well PW as a field effect transistor. In the MISFET Q1 having the gate electrode GE1 as its gate electrode, the insulating film 11 located below the gate electrode GE1 functions as a gate insulating film and in the MISFET Q2 having the gate electrode GE2 as its gate electrode, the insulating film 12 located below the gate electrode GE2 functions as a gate insulating film. The thickness of the gate insulating film (here, the insulating film 11) of the MISFET Q1 is greater than the thickness of the gate insulating film (here, the insulating film 12) of the MISFET Q2 and the breakdown voltage of the MISFET Q1 is greater than that of the MISFET Q2. This enables to make the operation voltage of the MISFET Q1 greater than that of the MISFET Q2. The MISFET Q1 is formed in the high breakdown voltage MIS region 1A, while the MISFET Q2 is formed in the low breakdown voltage MIS region 1B.

Here, the n channel MISFET has been formed as a MISFET, but instead of the n channel MISFET, a p channel MISFET may be formed. In this case, the conductivity type of each of the p well PW, the extension regions EX, and the source/drain regions SD may be reversed (meaning that the p well PW may be formed an n well, the extension regions EX may be formed as p type ones, and the source/drain regions SD may be formed as p type ones). It is also possible to form both the n channel MISFET and the p channel MISFET.

It is also possible, in FIG. 26, to provide (place), between the high breakdown voltage MIS region 1A and the low breakdown voltage MIS region 1B (between the region where MISFET Q1 has been formed and the region where MISFET Q2 has been formed), an element isolation region 4.

Next, it is also possible to form a low-resistance metal silicide layer (not shown) made of cobalt silicide or nickel silicide on the surface (surface layer portion or upper layer portion) of the gate electrode GE and the source/drain regions SD by using Salicide (Self Aligned Silicide) technology. This metal silicide layer can be formed, for example, by depositing a metal film such as a cobalt (Co) film or a nickel (Ni) film so as to cover the gate electrode GE and the source/drain regions SD therewith, followed by heat treatment. The unreacted metal film is then removed.

Figure 27:
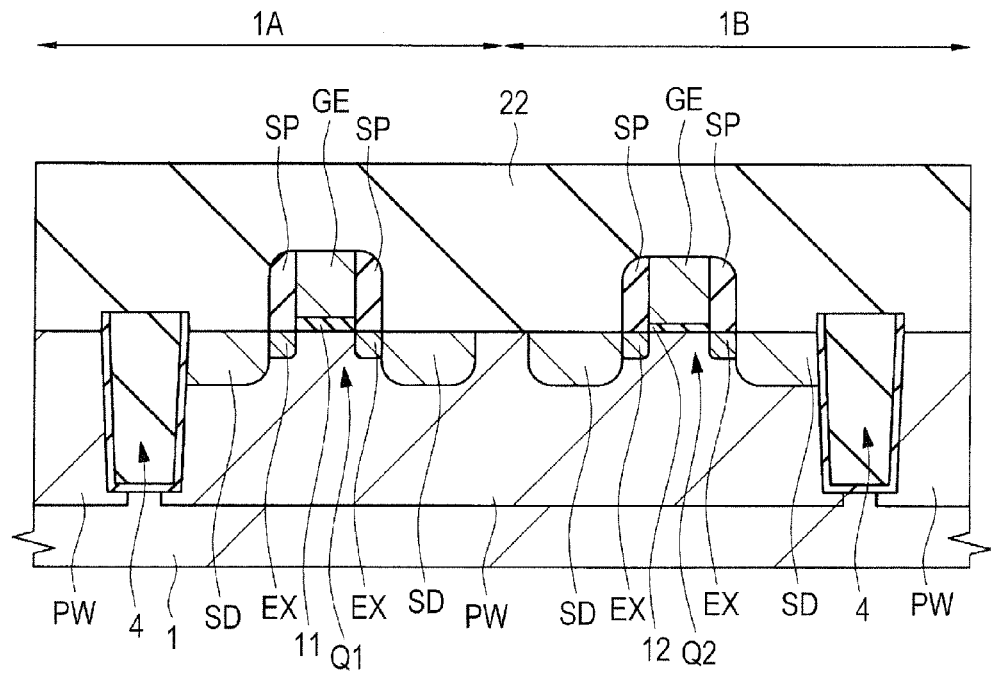
FIG. 27 is a fragmentary cross-sectional view showing the semiconductor device during a manufacturing step following that of FIG. 26.

Next, as shown in FIG. 27, an insulating film (interlayer insulating film) 22 is formed on the main surface (entire main surface) of the semiconductor substrate 1. Described specifically, the insulating film 22 is formed on the main surface of the semiconductor substrate 1 so as to cover therewith the gate electrode GE and the sidewall spacer SP. The insulating film 22 is made of, for example, a single silicon oxide film or a stack of a silicon nitride film and a silicon oxide film thicker than the silicon nitride film. Then, the surface (upper surface) of the insulating film 22 is polished by CMP or the like to planarize the upper surface of the insulating film 22. Even if the insulating film 22 has on the surface thereof irregularities due to an underlying step difference, an interlayer insulating film having a planarized surface can be obtained by polishing the surface of the insulating film 22 by CMP.

Figure 28:
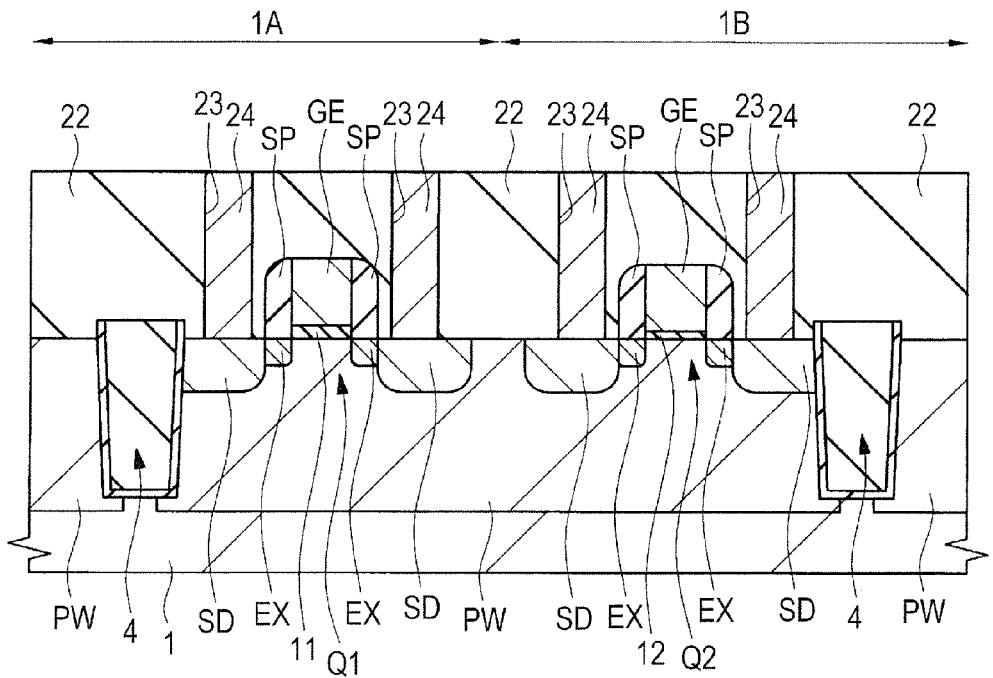
FIG. 28 is a fragmentary cross-sectional view showing the semiconductor device during a manufacturing step following that of FIG. 27.

Next, with a photoresist pattern (not shown) formed on the insulating film 22 as an etching mask, the insulating film 22 is dry etched to form a contact hole (a through-hole, a hole) 23 in the insulating film 22 as shown in FIG. 28. From the bottom portion of the contact hole 23, a portion of the main surface of the semiconductor substrate 1, for example, a portion of the surface of the source/drain regions SD (a metal silicide layer when it is formed on this surface) or a portion of the surface of the gate electrode GE (a metal silicide layer when it is formed on this surface) is exposed.

Next, a conductive plug (coupling conductor portion) 24 made of tungsten (W) or the like is formed in the contact hole 23. This plug 24 is formed, for example, by forming a barrier conductor film (for example, a titanium film or a titanium nitride film, or film stack thereof) on the insulating film 22 including the inside (on the bottom portion and the side walls) of the contact hole 23 by plasma CVD or the like. Then, a main conductor film made of a tungsten film or the like is formed on the barrier conductor film by CVD so as to fill the contact hole 23 therewith. An unnecessary portion of the main conductor film and the barrier conductor film on the insulating film 22 is then removed by CMP or etch back to form the plug 24. To simplify the drawing, the main conductor film and the barrier conductor film are shown collectively as the plug 24. The plug 24 is, on the bottom portion thereof, brought into contact with the surface (a metal silicide layer when the metal silicide layer is formed on the surface) of the gate electrode GE or the source/drain regions SD and therefore, they are electrically coupled to each other.

Figure 29:
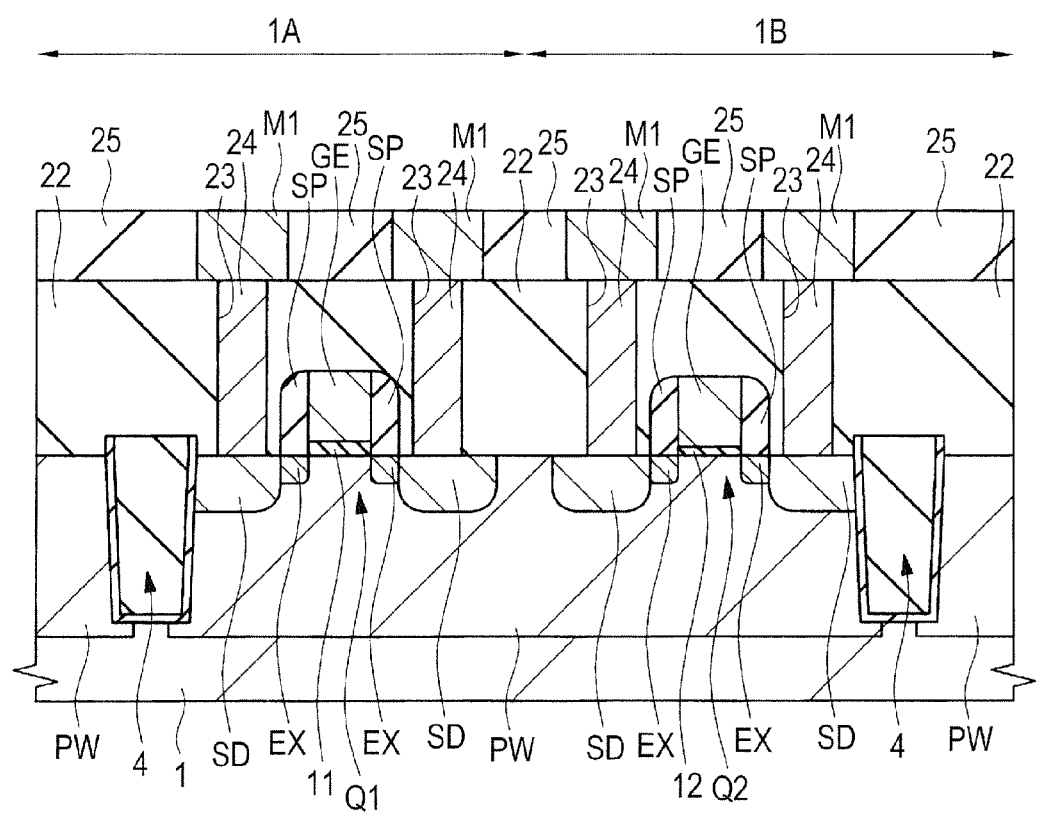
FIG. 29 is a fragmentary cross-sectional view showing the semiconductor device during a manufacturing step following that of FIG. 28.

Next, as shown in FIG. 29, an insulating film 25 is formed on the insulating film 22 having therein the plug 24. The insulating film 25 can be formed as a stack of a plurality of insulating films.

Next, a wiring M1 which is a first-level wiring is formed by the single damascene process. More specifically, the wiring M1 can be formed as described below. First, by dry etching (plasma dry etching) with a photoresist pattern (not illustrated) as a mask, a wiring trench is formed in a predetermined region of the insulating film 25. Then, a barrier conductor film (for example, a titanium nitride film, a tantalum film, or a tantalum nitride film) is formed on the insulating film 25 including the bottom portion and the side walls of the wiring trench. Next, a copper seed layer is formed on the barrier conductor film by CVD, sputtering, or the like. A copper plated film is then formed on the seed layer by using electroplating or the like to fill the wiring trench with the copper plated film. Then, the main conductor film (copper plated film and seed layer) and the barrier conductor film are removed from a region other than the wiring trench by CMP to form the first-level wiring M1 having, as a main conductive material thereof, copper buried in the wiring trench. To simplify the drawing, the barrier conductor film, the seed layer, and the copper plated film is shown collectively as the wiring M1.

The wiring M1 is electrically coupled to the gate electrode GE or the source/drain regions SD via the plug 24. Then, a second-level wiring is formed by the dual damascene process, but illustration and description on it is omitted here.

<Removal Step of Insulating Film 2 in Step S11>

Next, the removal step (wet etching step) of the insulating film 2 in Step S11 will be described more specifically.

Figure 30:
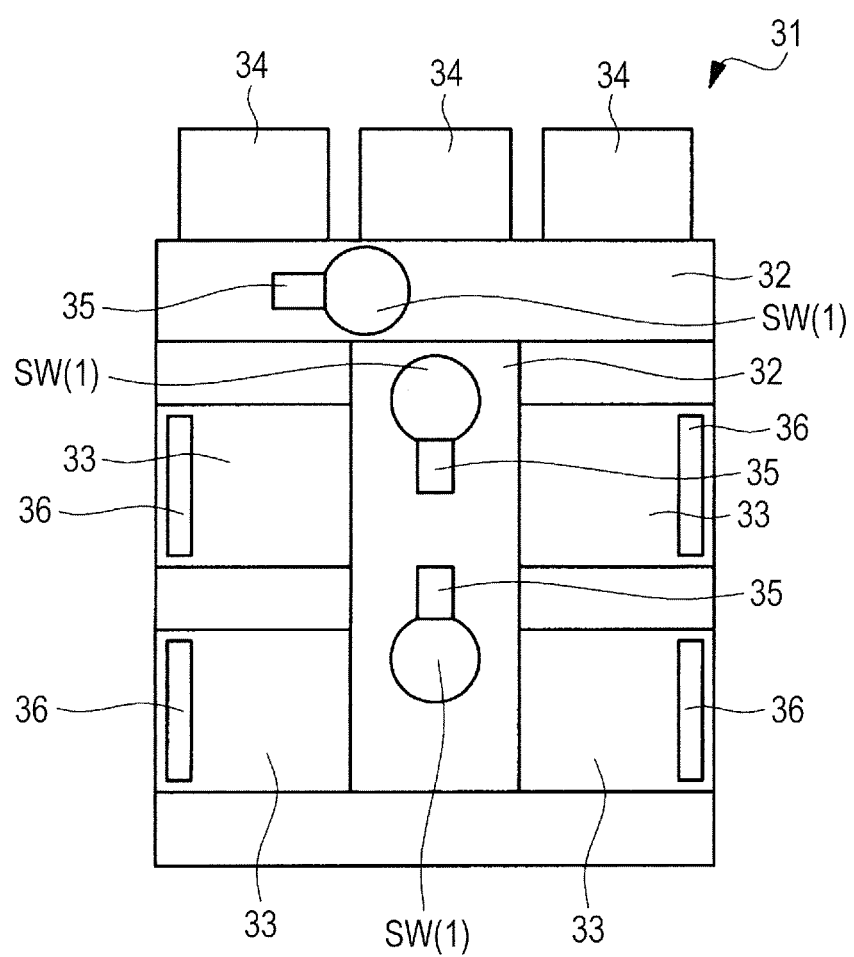
FIG. 30 is an explanatory view of a semiconductor manufacturing equipment (etching unit) used in the removal step (wet etching step) of the insulating film of Step S11.
Figure 31:
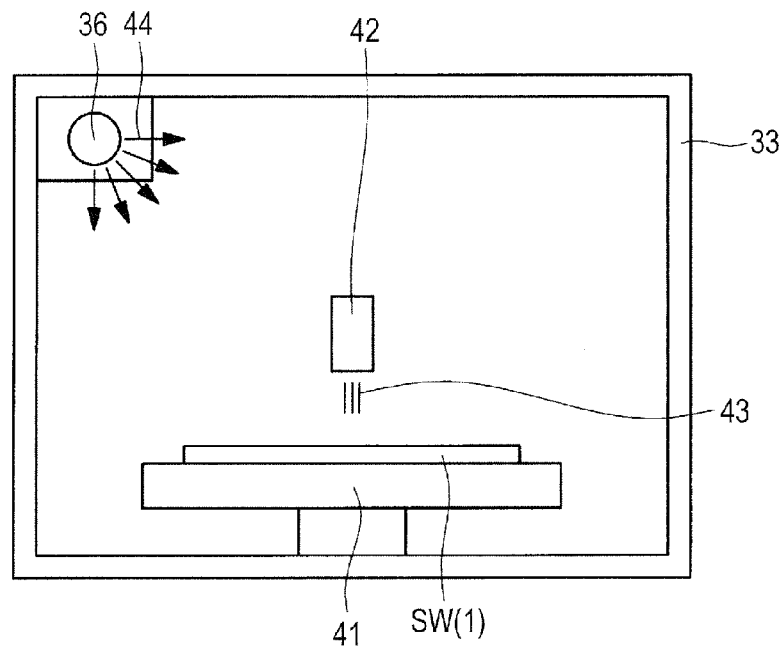
FIG. 31 is an explanatory view of a semiconductor manufacturing equipment (etching unit) used in the removal step (wet etching step) of the insulating film of Step S11.

FIGS. 30 and 31 are explanatory views of a semiconductor manufacturing equipment (etching equipment) 31 used in the removal step (wet etching step) of the insulating film 2 in Step S11. FIG. 30 is an overall plan view schematically showing the semiconductor manufacturing equipment 31, while FIG. 31 is a cross-sectional view schematically showing each etching chamber 33 of the semiconductor manufacturing equipment 31.

First, a description will be made on the procedure of removing the insulating film 2 in Step S11 by using the semiconductor manufacturing equipment 31 of FIG. 30.

As shown in FIG. 30, the semiconductor manufacturing equipment 31 has a transfer chamber 32 and a plurality of etching chambers 33 and load ports (load port chambers) 34 placed around the transfer chamber 32. It is a so-called multichamber type semiconductor manufacturing equipment. The transfer chamber 32 and the etching chamber 33, and the transfer chamber 32 and the load port (load port chamber) 34 are coupled each other via a gate valve (not illustrated) which is an opening and closing unit.

First, after FOUP (not shown) is docked to a lord port (lord port chamber) 34, a semiconductor wafer SW is taken out from the FOUP and is carried in the transfer chamber 32. The semiconductor wafer SW corresponds to the above semiconductor substrate 1 (this means that the semiconductor wafer SW can be regarded as the semiconductor substrate 1). The FOUP is a hermetic enclosure for the batch transfer of semiconductor wafers. It usually stores therein 25, 12, or 6 semiconductor wafers per batch unit.

The semiconductor wafer SW is then carried from the transfer chamber 32 to the etching chamber 33 by using a transfer robot 35 or the like. In the etching chamber 33, the insulating film 2 is removed (wet etched) from the semiconductor wafer SW (the treatment of Step S11).

In the present embodiment, as a light source for applying light (irradiating light) to the semiconductor wafer SW, a lighting system (light source) 36 is placed in the etching chamber 33. As the lighting system 36, for example, a fluorescent lamp can be used. The treatment for removing (wet etching) the insulating film 2 from the semiconductor wafer SW is conducted while applying light to the semiconductor wafer SW from the lighting system 36.

After the treatment for removing (wet etching) the insulating film 2 is conducted in the etching chamber 33, the semiconductor wafer SW is transferred from the etching chamber 33 to the transfer chamber 32, transferred to the load port (load port chamber) 34, and then returned to the FOUP, by using a transfer robot 35 or the like. After that, the semiconductor wafer SW is transferred to the semiconductor manufacturing equipment where the wafer is subjected to next steps.

Next, the removal treatment (wet etching treatment) of the insulating film 2 to be conducted in the etching chamber (etching equipment) 33 in Step S11 will be described specifically referring to FIG. 31.

As shown in FIG. 31, a rotating stage (wafer rotating stage, spin base) 41 is placed in the etching chamber 33. This rotating stage 41 is a rotating plate included rotatable at a high speed by a rotating mechanism (such as motor) not shown here and has a diameter greater than that of, for example, the semiconductor wafer SW. The semiconductor wafer SW carried in the etching chamber 33 is mounted (placed) on this rotating stage 41 and is retained on this rotating stage 41 with a chuck mechanism or the like not illustrated here. At this time, the semiconductor wafer SW is placed and fixed with the main surface (surface or main surface on the side where the semiconductor element is formed) on which the insulating film 2 has been formed up and with the back surface, which is the surface opposite to the main surface, down. By rotating the rotating stage 41 by means of the rotating mechanism not shown here, the semiconductor wafer SW retained on the rotating stage 41 can also be rotated.

This etching chamber is included so that a nozzle 42 is placed above the rotating stage 41 (for example, above the center portion of the main surface of the semiconductor wafer SW fixed to the rotating stage 41) and from this nozzle 42, an etching solution (cleaning solution, etchant, or chemical solution) 43 is injected (jetted, supplied) to the main surface of the semiconductor wafer SW to supply the etching solution 43 to the main surface of the semiconductor wafer SW. As the etching solution 43, that capable of etching the insulating film 2 formed on the main surface of the semiconductor wafer SW is used. An aqueous solution of hydrofluoric acid (HF) is suited for use.

The concentration of hydrofluoric acid used as the etching solution 43 is not limited insofar as an intended etching amount can be secured in an etching time within a range not interfering with the productivity. For example, it may be set at about 5 wt % or less.

In order to remove the insulating film 2 formed on the main surface of the semiconductor wafer SW, after the semiconductor wafer SW having the insulating film 2 thereon is placed and fixed onto the rotating stage 41 in the etching chamber 33 (fixed so that the main surface of the semiconductor wafer SW on which the insulating film 2 has been formed is on the side of the nozzle 42), the rotating stage 41 is rotated and thereby the semiconductor wafer SW held on the rotating stage 41 is rotated. At this time, it is preferred to make the rotation center of the rotating stage 41 and the center position of the main surface of the semiconductor wafer SW coincide with each other and thereby rotate them with the center position of the main surface of the semiconductor wafer SW as a rotation center.

The etching solution 43 for etching the insulating film 2 on the main surface of the semiconductor wafer SW is supplied from the nozzle 42 to the main surface of the semiconductor wafer SW while rotating the semiconductor wafer SW. The etching solution 43 is therefore supplied to the main surface of the semiconductor wafer SW from the nozzle 42 and by this etching solution 43, the insulating film 2 formed on the main surface of the semiconductor wafer SW is etched (wet etched). Due to the rotation of the semiconductor wafer SW, the etching solution 43 supplied from the nozzle 42 to the vicinity of the center portion of the main surface of the semiconductor wafer SW moves from the center portion of the main surface of the semiconductor wafer SW to the outer circumference side. Thus, the etching solution 43 is distributed throughout the main surface of the semiconductor wafer SW and etching of the insulating film 2 by the etching solution 43 is conducted all over the main surface of the semiconductor wafer SW.

In order to stop etching of the insulating film 2, supply of the etching solution 43 from the etching solution nozzle 42 to the main surface of the semiconductor wafer SW is stopped and a rinse solution (rinse liquid) such as pure water is then supplied from the nozzle 42 to the main surface (to the vicinity of the center portion) of the rotating semiconductor wafer SW. This rinse solution is delivered throughout the main surface of the semiconductor wafer SW and the main surface of the semiconductor wafer SW is rinsed with the solution. The etching solution 43, together with the rinse solution, is removed from the main surface of the semiconductor wafer SW, by which etching of the insulating film 2 on the main surface of the semiconductor wafer is stopped. The nozzle (nozzle 42) may be made to serve as both the nozzle for supplying the etching solution 43 to the semiconductor wafer SW and the nozzle for supplying a rinse solution to the semiconductor wafer SW (nozzle 42). Alternatively, respective nozzles may be used for them.

In the present embodiment, the etching chamber 33 is as described above, equipped with a lighting system (light source) 36 for controlling the illuminance on the main surface of the semiconductor wafer SW during wet etching of the insulating film 2. The lighting system 36 functions as a light source for outputting light 44. FIG. 31 schematically shows, with an arrow, the light 44 output from the lighting system 36. The lighting system 36 is provided because by applying (irradiating) the light 44 to the semiconductor wafer SW from the lighting system 36, the illuminance of the semiconductor wafer SW during etching of the insulating film 2 is positively increased. This means that while the insulating film 2 is etched with the etching solution 43 supplied to the semiconductor wafer SW, the illuminance on the main surface of the semiconductor wafer SW is increased by lighting the main surface of the semiconductor wafer SW by using the lighting system 36 (applying the light 44 from the lighting system 36 to the main surface of the semiconductor wafer SW).

In the present embodiment, etching (wet etching with the etching solution 43) of the insulating film 2 on the main surface of the semiconductor wafer SW is conducted while applying (irradiating) light (light output by the lighting system 36) from the lighting system 36 to the main surface of the semiconductor wafer SW. At this time, it is preferred to continuously apply the light 44 from the lighting system 36 to the main surface of the semiconductor wafer SW during the period from starting of wet etching of the insulating film 2 on the main surface of the semiconductor wafer SW with the etching solution 43 (from the time point when the etching solution 43 is brought into contact with the main surface of the semiconductor wafer SW) to completion of wet etching (to the tie point when the rinse solution drives out the etching solution 43 from the main surface of the semiconductor wafer SW).

When the insulating film 2 is wet etched with the etching solution 43, the light 44 from the lighting system 36 may be applied (irradiated) to the entire main surface of the semiconductor wafer SW or may be applied (irradiated) to a portion of the main surface of the semiconductor wafer SW. For example, a portion of the light 44 output from the lighting system 36 toward the main surface of the semiconductor wafer SW may be blocked by the nozzle 42 and the light 44 from the lighting system 36 may be applied (irradiated) not to the entire main surface of the semiconductor wafer SW but to a portion of the main surface of the semiconductor wafer SW. However, since the semiconductor wafer SW rotates with the rotating stage 41, even if the light 44 from the lighting system 36 is applied (irradiated) to a portion of the main surface of the semiconductor wafer SW, a region of the main surface of the semiconductor wafer SW irradiated with the light 44 moves within the main surface of the semiconductor wafer SW with the rotation of the semiconductor wafer SW. While the insulating film 2 is wet etched with the etching solution 43, any region of the main surface of the semiconductor wafer SW can have a period of being irradiated with the light 44 from the lighting system 36. In other words, it is only necessary to irradiate the light 44 from the lighting system 36 to at least a portion of the main surface of the semiconductor wafer SW so that any region of the main surface of the semiconductor wafer SW has a period of being irradiated with the light 44 from the lighting system 36 while the insulating film 2 is wet etched with the etching solution 43. In short, it is only necessary to prevent presence of a region, on the main surface of the semiconductor substrate 1 (semiconductor wafer SW), not irradiated with the light 44 during wet etching of the insulating film 2.

The reason of it will be described later. Anyway, it is more preferred, in the present embodiment, to carry out wet etching of the insulating film 2 (with the etching solution 43) while applying light of 140 lux or greater to at least a portion of the main surface of the semiconductor wafer SW (entire main surface or a portion of the main surface of the semiconductor wafer SW). In addition, it is more preferred that any region of the main surface of the semiconductor wafer SW has a period of being irradiated with light of 140 lux or greater during wet etching of the insulating film 2 (with the etching solution 43). The light of 140 lux or greater means that the illuminance of the main surface of the semiconductor wafer SW is 140 lux or greater. The illuminance of the main surface of the semiconductor wafer SW can be controlled by the brightness of the light source (here, the lighting system 36) or distance from the light source (here, the lighting system 36) to the main surface of the semiconductor wafer SW.

<Defects Caused by the Formation of the Element Isolation Region>

Next, a description will be made on the defects caused by the formation of the element isolation region.

Figure 32:
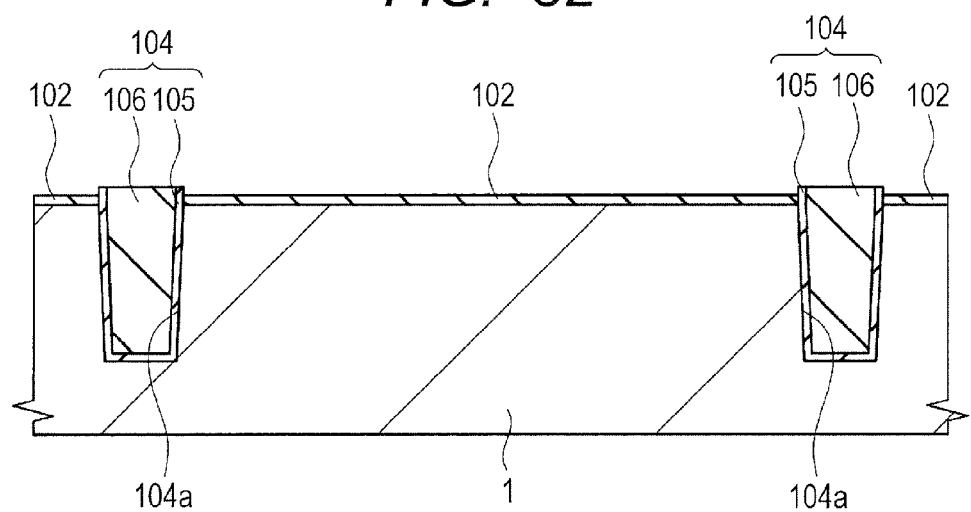
FIG. 32 is an explanatory view of a defect generated when the oxide film is removed from the main surface of the semiconductor substrate by wet etching.
Figure 33:
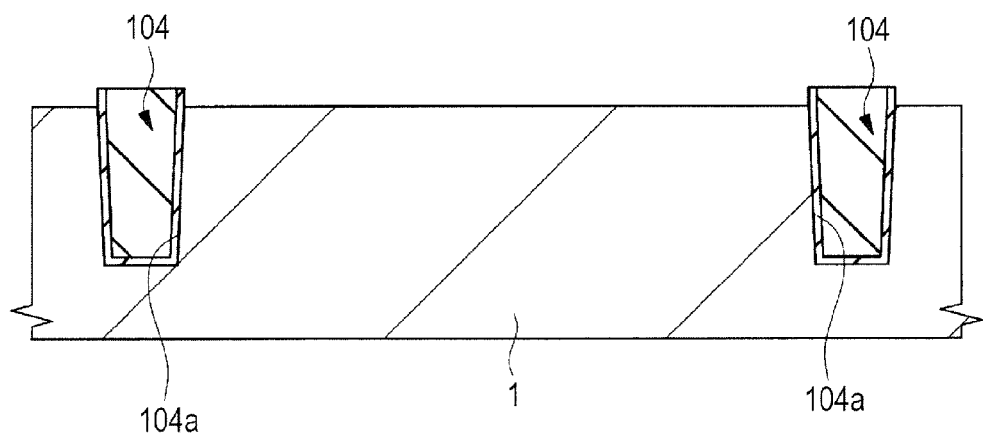
FIG. 33 is an explanatory view of a defect generated when the oxide film is removed from the main surface of the semiconductor substrate by wet etching.
Figure 34:
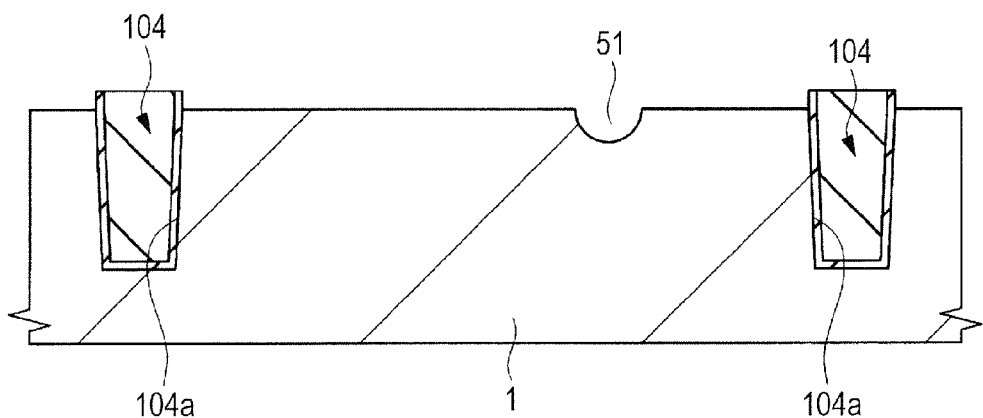
FIG. 34 is an explanatory view of a defect generated when the oxide film is removed by wet etching from the main surface of the semiconductor substrate.

FIGS. 32 to 34 are explanatory views of defects caused when an oxide film 102 corresponding to the insulating film 2 is removed by wet etching.

In FIGS. 32 to 34, the oxide film 102 corresponds to the insulating film 2, a trench 104*a* corresponds to the trench 4*a*, an insulating film 105 corresponds to the insulating film 5, an insulating film 106 corresponds to the insulating film 6, and an element isolation region 104 formed from the insulating films 105 and 106 buried in the trench 104*a* corresponds to the element isolation region 4.

FIG. 32 shows the stage before a step of removing (wet etching) the oxide film 102, which step corresponds to Step S11. FIG. 33 shows the stage after the step of removing (wet etching) the oxide film 102, which step corresponds to Step S11. FIG. 34 shows a pit (recess, hole) formed in the semiconductor substrate 1 as a result of removal of the oxide film 102.

The structure (state) shown in FIG. 32 is formed by carrying out steps almost similar to those conducted until the structure (state) of FIG. 14 is obtained. After the state of FIG. 32, the oxide film 102 is removed by wet etching with hydrofluoric acid to expose the semiconductor substrate 1 (Si surface thereof) and obtain the structure (state) of FIG. 33 corresponding to FIG. 15. According to the analysis by the present inventors, as the oxide film 102 is removed, a pit (recess, hole) 51 is sometimes formed in the semiconductor substrate 1 as shown in FIG. 34. This pit 51 occurs when in an active region surrounded with the element isolation region 104, the oxide film 102 is wet etched to expose the semiconductor substrate 1 (Si surface thereof).

As a result of investigation by the present inventors, it has been found that this pit 51 occurs mainly because of charges accumulated (charged) in the oxide film 102 during various steps for forming the element isolation region 104. When the oxide film 102 becomes thin with the progress of wet etching of the oxide film 102, charges (charges accumulated in the oxide film 102) are released to the side of the semiconductor substrate 1 and this discharge results in the formation of the pit 51 in the semiconductor substrate 1.

There is a fear of the pit 51, which has occurred in the semiconductor substrate 1, deteriorating the reliability of a semiconductor chip (semiconductor device) obtained from the semiconductor chip region (a region of the semiconductor wafer from which individual semiconductor chips will be obtained later is called "semiconductor chip region") including the pit 51. In addition, selection and removal of semiconductor chips obtained from the semiconductor chip region including the pit 51 may deteriorate the production yield of semiconductor devices and become a cause of cost increase.

The cause of accumulation of charges in the oxide film 102 has therefore been studied. As a result, it has been found that when plasma is used in various steps for forming the element isolation region 104, charges due to plasma are accumulated in the insulating film formed on the main surface of the semiconductor substrate 1, which is a main cause. Plasma dry etching (step corresponding to Step S4) for forming the element isolating trench 104a has a particularly great influence. Since the element isolating trench 104a has a great depth, it takes much time for plasma dry etching for the formation of the trench 104a. Charges due to plasma tend to be accumulated in the insulating film formed on the main surface of the semiconductor substrate 1 (the insulating film tends to be charged) when plasma dry etching is conducted for the formation of the trench 104a. The charges accumulated in the insulating film on the main surface of the semiconductor substrate 1 during formation of the trench 104a are not removed easily and moreover, formation of the trench acts to increase the charges accumulated in the insulating film 102 in the stage of FIG. 32.

In addition to the formation step of the trench 104a, a step (a step corresponding to Step S6) of forming the insulating film 106 (corresponding to the insulating film 6) to be buried in the trench 104a has also a great influence on the charge accumulation. Since the trench 104a has a great depth, the insulating film 106 to be buried in the trench 104a should be thick enough to bury the trench 104a. When plasma CVD is employed for the formation of this thick insulating film 106, charges due to plasma tend to be accumulated at the time of formation of the insulating film 106 (the insulating film tends to be charged). Charges accumulated during the formation of the insulating film 106 cannot be removed easily and moreover, the formation of the insulating film acts to increase the charges accumulated in the oxide film 102 in the stage of FIG. 32. Such a phenomenon occurs when plasma CVD is employed for the formation of the insulating film 106. It is marked particularly when HDP-CVD having a high plasma density is used for the formation of the insulating film 106.

Thus, the formation step of the trench 104a and the formation step of the insulating film 106 act to increase charges accumulated in the oxide film 102 in the stage of FIG. 32. In addition to the formation step of the trench 104a and the formation step of the insulating film 106, plasma dry etching steps corresponding to Steps S7 and S9 also make use of plasma so that when these steps are conducted, they act to increase the charges accumulated in the oxide film 102 in the stage of FIG. 32. In various cleaning steps conducted between the formation of the oxide film 102 and the formation of the structure shown in FIG. 32 or a CMP step corresponding to Step S8, accumulation of charges (charging) due to static electricity occurs, though having less influence than plasma treatment. They also act to increase the charges accumulated in the oxide film 102 in the stage of FIG. 32.

Thus, during the period from the formation of the oxide film 102 to the formation of the structure shown in FIG. 32, charges accumulated in the insulating film formed on the main surface of the semiconductor substrate 1 in various steps for forming the element isolation region 104 are charged in the oxide film 102 in the stage (stage of FIG. 32) just before removal of the oxide film 102. These charges are, when the oxide film 102 becomes thin just before the semiconductor substrate 1 is exposed in the step of wet etching the oxide film 102 to expose the semiconductor substrate 1 (step from FIG. 32 to FIG. 33), discharged and due to this discharge, a pit 51 is formed in the semiconductor substrate 1. In short, since in various steps for the formation of the element isolation region 104, charges tend to be accumulated, and during the period between the formation of the oxide film 102 and the removal of the oxide film 102 by wet etching (step from FIG. 32 to FIG. 33), the semiconductor substrate 1 (Si surface thereof) is not exposed, discharge tends to occur at the time of removal of the oxide film 102 and it inevitably forms the pit 51. In the active region surrounded with the element isolation region 104, charges accumulated in the oxide film 102 have no escape so that just before the active region (Si surface thereof) of the oxide film 102 is exposed by wet etching, charges are released from the side of the oxide film 102 to the side of the semiconductor substrate 1 (Si region) in the active region and a pit 51 is formed. For wet etching of the oxide film 102, an ion-containing liquid such as an aqueous solution of hydrofluoric acid is used, but using such a liquid cannot completely remove charges from the charged oxide film 102 and formation of a pit 51 due to discharge cannot be avoided.

<Main Features and Advantages of the Present Embodiment>

In the present embodiment, in the step of removing (wet etching) the insulating film 2 in Step S11, the light 44 from the lighting system 36 is applied (irradiated) to the semiconductor wafer SW. This means that in Step S11, the insulating film 2 is wet etched while applying the light 44 from the lighting system 36 to the semiconductor wafer SW. The light 44 is applied to the semiconductor wafer SW because charges (mainly electrons here) are generated in a Si substrate (a Si substrate region corresponding to the semiconductor substrate 1) by making use of a photoelectric effect and they are supplied from the side of the Si substrate to the side of the insulating film 2 to neutralize (combine the electrons with holes to eliminate) the charges (mainly, holes have been accumulated) which have already been accumulated in the insulating film 2.

Figure 35A:
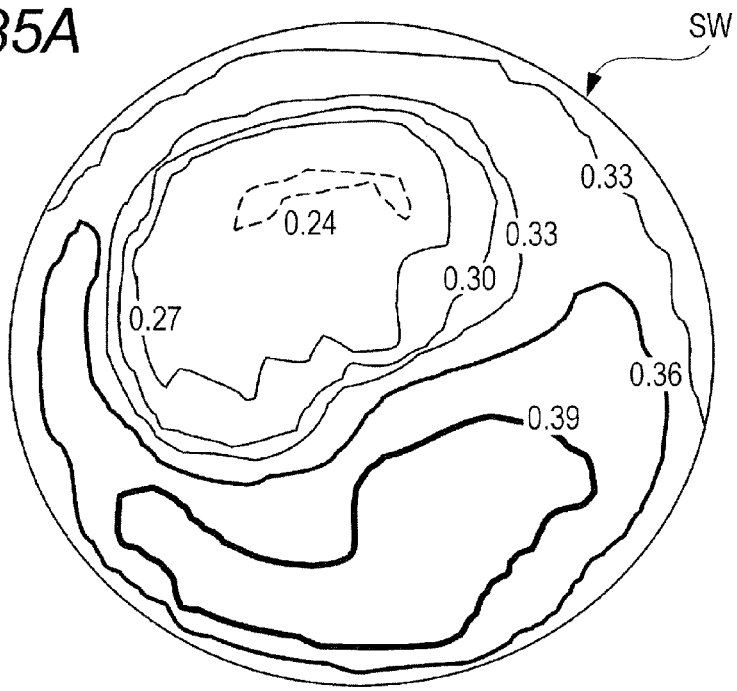
FIGS. 35(*a*) and (*b*) are explanatory views of a charge distribution on the main surface of the semiconductor wafer.
Figure 35B:
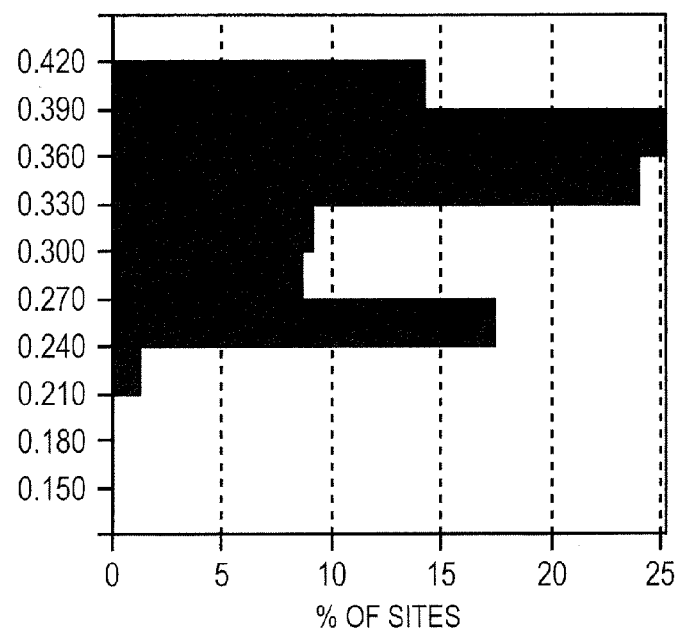
Figure 36A:
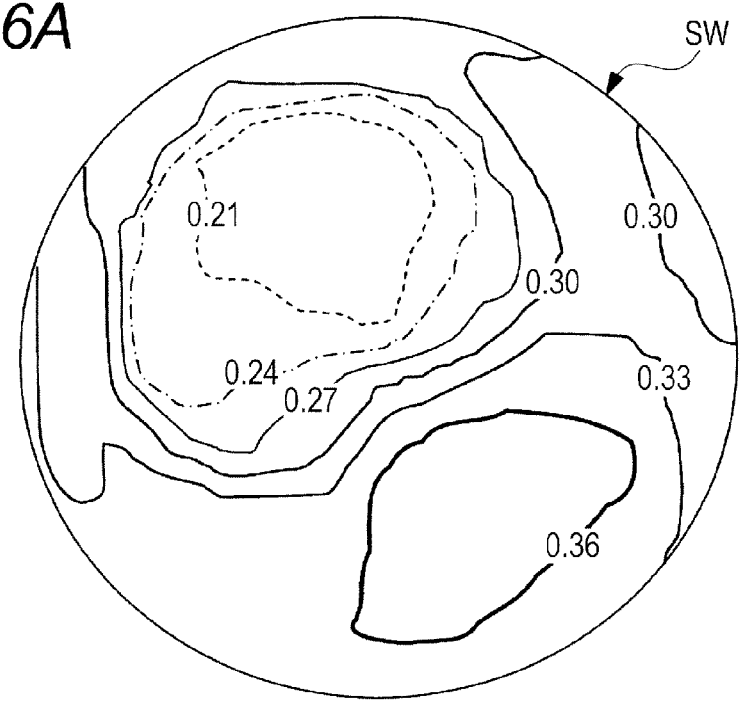
FIGS. 36(*a*) and (*b*) are explanatory views of a charge distribution on the main surface of the semiconductor wafer.
Figure 36B:
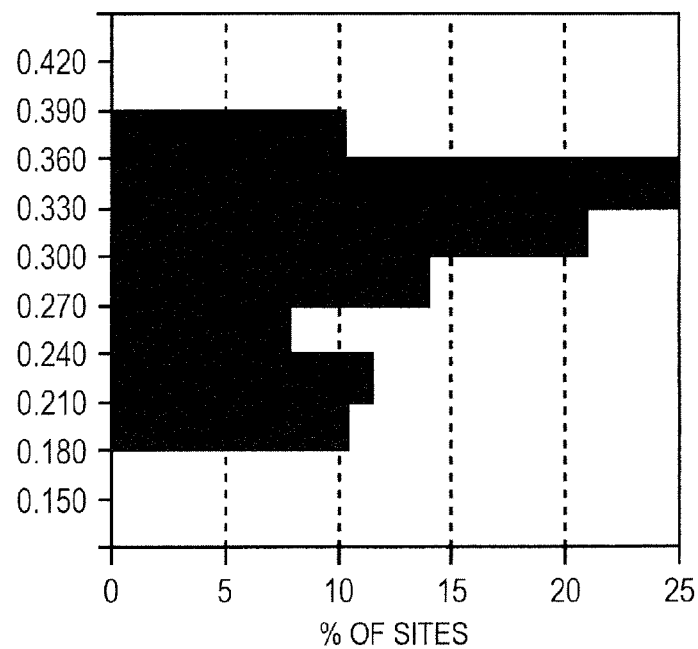

FIGS. 35(a) and (b) and FIGS. 36(a) and (b) are explanatory views of a charge distribution of the main surface of the semiconductor wafer SW after subjected to a step corresponding to Step S11. FIGS. 35(a) and (b) show the distribution when, different from the present embodiment, Step S11 (wet etching of the insulating film 2) is conducted without applying the light 44 from the lighting system 36 to the semiconductor wafer SW, while FIGS. 36(a) and (b) show the distribution when, as in the present embodiment, Step S11 (wet etching of the insulating film 2) is conducted while applying the light 44 from the lighting system 36 to the semiconductor wafer SW. FIGS. 35(a) and 36(a) show, by contours, the charge distribution (distribution of charges accumulated) of the main surface of the semiconductor wafer SW when Step S11 is conducted. The greater the number of the contours, the greater the charge density (density of accumulated charges) per unit area. FIGS. 35(b) and 36(b) show a histogram (frequency distribution) of the distribution shown in (a). The number along the ordinate of the histogram of (b) corresponds to the number of the contour and a proportion (indicated by percent) of charges in the total area of the main surface of the semiconductor wafer SW is plotted along the abscissa of the histogram (b). The distribution shown in FIGS. 35(a) and 36(a) is measured using a surface charge measuring apparatus.

As is apparent from the comparison between FIG. 35 and FIG. 36, application of the light 44 from the lighting system 36 to the semiconductor wafer SW can reduce the amount (density) of charges accumulated therein. This is presumed to occur because charges (mainly, electrons here) are supplied from the side of the Si substrate region (Si substrate region corresponding to the semiconductor substrate 1) to the side of the insulating film due to the photoelectric effect caused by the light 44 from the lighting system 36 and they can neutralize the charges (mainly holes are accumulated) accumulated in the insulating film.

Figure 37:
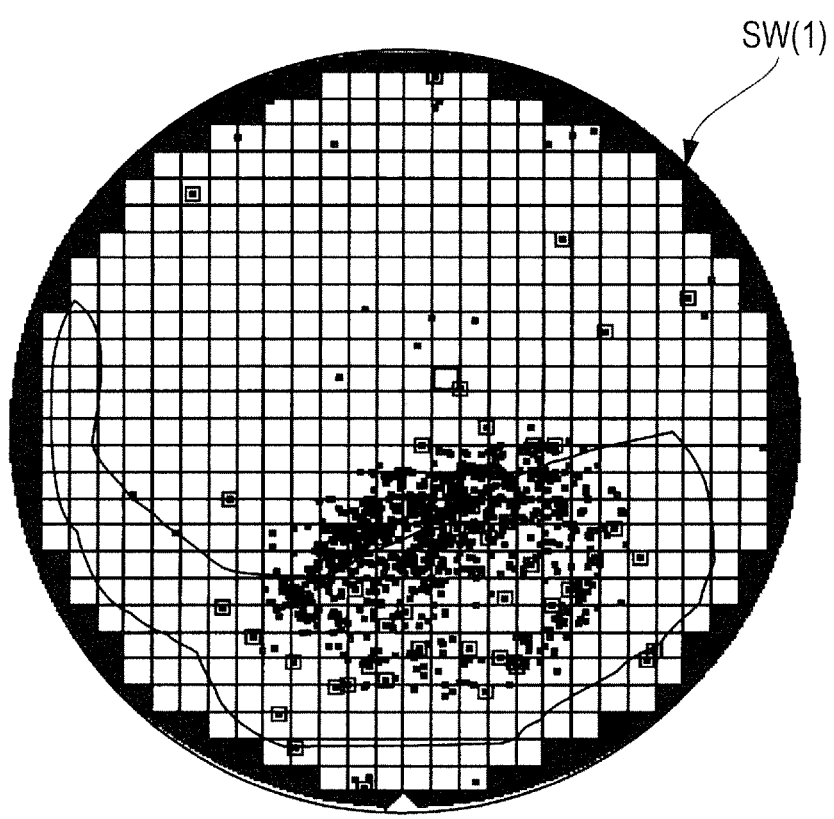
FIG. 37 is an explanatory view showing the occurrence of pits.

FIG. 37 is an explanatory view showing the occurrence of the pit 51. The distribution of the pit 51 generated when the wet etching step (step from FIG. 32 to FIG. 33) of the oxide film 102 formed on the main surface of the semiconductor wafer SW is conducted, different from the present embodiment, without applying the light 44 from the lighting system 36 to the semiconductor wafer SW. The positions of the pit 51 are shown as black dots on the main surface of the semiconductor wafer SW in FIG. 37 and it is apparent from FIG. 37 that the pit 51 occurs densely at certain positions on the main surface of the semiconductor wafer SW. As is apparent from the comparison between FIG. 37 and FIG. 35(a), a region on the main surface of the semiconductor wafer SW in FIG. 37 where the pits 51 have been densely generated nearly coincides with a region on the main surface of the semiconductor wafer SW of FIG. 35(a) where the density of charges accumulated in the main surface of the semiconductor wafer SW is relatively high (high correlation). This suggests that the pit 51 is likely to occur in a region, in the oxide film 102 formed on the main surface of the semiconductor wafer SW, where charges have been accumulated at a high density.

In the present embodiment, on the other hand, a charge density can be decreased by carrying out Step S11 (wet etching of the insulating film 2) while applying the light 44 from the lighting system 36 to the semiconductor wafer SW and neutralizing charges accumulated in the insulating film 2 on the main surface of the semiconductor wafer SW by making use of a photoelectric effect, occurrence of pits (defects corresponding to the pit 51) in a substrate region can be suppressed or prevented. If the distribution of the present embodiment is shown as in FIG. 37, the pits 51 are hardly observed.

Energy of 1.1 eV or greater is necessary for causing a photoelectric effect of Si. The light energy is represented by the following equation 1:

$$E = h\nu = h \times c/\lambda \quad \text{(Equation 1)}.$$

In the equation 1, E represents energy, h represents a Planck's constant, ν represents the number of vibration, c represents the speed of light, and λ represents a wavelength. It can be understood from the Equation 1 that light having a wavelength not greater than 1127 nm is necessary to give energy of 1.1 eV or greater. In Step S11 (wet etching step of the insulating film 2), light having a wavelength not greater than 1127 nm is necessary as the light 44 to be irradiated to the semiconductor wafer SW.

Thus, in the present embodiment, in Step S11, formation of the pit 51 is suppressed or prevented by wet etching the insulating film 2 while applying (irradiating) light (more specifically, the light 44 from the lighting system 36) to the semiconductor wafer SW (semiconductor substrate 1). At this time, the light 44 irradiated to the semiconductor wafer SW is preferably set at 140 lux or greater. This "140 lux or greater" corresponds to the illuminance of 140 lux or greater at the main surface of the semiconductor wafer SW. When the illuminance of the main surface of the semiconductor wafer SW is small, a sufficient photoelectric effect cannot be obtained. By setting the light 44 irradiated to the semiconductor wafer SW at 140 lux or greater, charges (mainly electrons here) can be generated properly in the Si substrate (Si substrate region corresponding to the semiconductor substrate 1) due to a photoelectric effect, making it possible to sufficiently prevent occurrence of the pit 51.

For suppressing occurrence of the pit 51, wet etching of the insulating film 2 (carrying out Step S11) while applying light (preferably light of 140 lux or greater) to the main surface of the semiconductor wafer SW is important. Even if light is irradiated to the semiconductor wafer SW prior to Step S11, when it is not applied to the semiconductor wafer SW during wet etching (Step S11) of the insulating film 2, the effect of suppressing occurrence of the pit 51 is not sufficient. This is because of the following reason.

Described specifically, when light is irradiated to the semiconductor wafer SW having the insulating film 2 thereon, the light is required to pass through the insulating film 2 and reach the Si substrate region in order to cause a photoelectric effect so that irradiation of light when the insulating film 2 becomes thin is effective. When light is irradiated to the semiconductor wafer SW before Step S11, the insulating film 2 is relatively thick so that a photoelectric effect is not sufficient. On the other hand, when wet etching of the insulating film 2 is conducted while applying light (preferably light of 140 lux or greater) to the main surface of the semiconductor wafer SW in Step S11 as in the present embodiment, the insulating film 2 is wet etched and becomes thinner while being irradiated with light. Light therefore easily reaches the Si substrate region of the semiconductor wafer SW, which makes it possible to efficiently generate charges (mainly electrons, here) due to a photoelectric effect. The effect of suppressing occurrence of the pit 51 can therefore be achieved reliably. In addition, when the insulating film 2 is wet etched in Step S11 while applying light to the main surface of the semiconductor wafer SW as in the present embodiment, the charge density (charge density per volume) accumulated in the insulating film 2 gradually increases with a decrease in the thickness of the insulating film 2. At this time, when charges (mainly electrons) due to a photoelectric effect are supplied, electrons and holes combine, leading to disappearance of them. The effect of suppressing occurrence of the pit 51 can therefore be achieved reliably.

The following is a summary of the irradiation method of the light 44 to the semiconductor substrate 1 (semiconductor wafer SW) in Step S11 in the present embodiment.

In the present embodiment, the insulating film 2 is wet etched while applying the light 44 (preferably, light of 140 lux or greater) to the main surface of the semiconductor substrate 1 (semiconductor wafer SW) in Step S11. At this time, the insulating film 2 is wet etched while applying the light 44 (preferably, light of 140 lux or greater) to at least a portion of the main surface of the semiconductor substrate 1 (semiconductor wafer SW), which makes it possible to suppress or prevent occurrence of the pit 51 in the region of the main surface of the semiconductor substrate 1 (semiconductor wafer SW) to which the light 44 has been irradiated.

In addition, in the present embodiment, in Step S11, the insulating film 2 is wet etched while rotating the semiconductor substrate 1 (semiconductor wafer SW) and applying the light 44 (preferably, light of 140 lux or greater) to at least a portion of the main surface of the rotating semiconductor substrate 1 (semiconductor wafer SW). Even if the light 44 is irradiated not to the entire surface but to a portion of the main surface of the semiconductor substrate 1 (semiconductor wafer SW), the region irradiated with the light 44 move within the main surface of the semiconductor substrate 1 (semiconductor wafer SW) with the rotation of the semiconductor substrate 1 (semiconductor wafer SW). An effective area of the region irradiated with the light 44 on the main surface of the semiconductor substrate 1 (semiconductor wafer SW) can be increased. This makes it possible to widen a region of the main surface of the semiconductor substrate 1 (semiconductor wafer SW) which can be prevented from occurrence of the pit 51.

In the present embodiment, in Step S11, it is preferred that any region of the main surface of the semiconductor substrate 1 (semiconductor wafer SW) has, during wet etching of the insulating film 2, a period of being irradiated with the light 44 (preferably, light of 140 lux or greater). In other words, in Step S11, it is preferred that during wet etching of the insulating film 2, the main surface of the semiconductor substrate 1 (semiconductor wafer SW) does not have a region not irradiated with the light 44 (preferably, light of 140 lux or greater). This makes it possible to achieve the effect of suppressing or preventing occurrence of the pit 51 in any region of the main surface of the semiconductor substrate 1 (semiconductor wafer SW).

Thus, in the present embodiment, a semiconductor device having improved reliability can be obtained by suppressing or preventing occurrence of the pit 51. In addition, production yield of the semiconductor device can be improved.

The present embodiment provides a technology of suppressing or preventing occurrence of the pit 51 due to easy accumulation of charges in various steps (particularly, step using plasma) for forming the element isolation region 4. Among these steps, the plasma dry etching step for forming the element isolating trench 4a is particularly influential to the accumulation of charges. In addition, the plasma CVD step for forming the insulating film 6 to fill the element isolating trench 4a also has a great influence. The present embodiment therefore has an effect of suppressing (preventing) occurrence of the pit 51 when applied to a method including at least one of the step of forming the element isolating trench 4a by plasma dry etching and the step of forming the insulating film 6 for filling the trench 4a by plasma CVD. If the present embodiment is applied to the method including both steps, it produces the best effect.

<Relationship Between Step S11 and Another Wet Etching Step>

In addition, in the present embodiment, the light 44 is irradiated to the semiconductor wafer SW in the wet etching step of the insulating film 2 in Step S11 in order to suppress or prevent occurrence of the pit 51 which will otherwise occur when the element isolation region 4 is formed. When wet etching of the insulating film is conducted to expose the semiconductor substrate 1 while having the insulating film and a resist layer thereon (photoresist layer functioning as an etching mask) on the main surface of the semiconductor substrate 1 (semiconductor wafer SW), however, light irradiated to the main surface of the semiconductor substrate 1 (semiconductor wafer SW) is controlled so as not to be 100 lux or greater. The resist layer (photoresist layer) undergoes a quality change (for example, becomes hard) when irradiated with light, making its removal difficult in a later step.

In Step S11, the insulating film 2 is wet etched while having no resist layer (photoresist layer) on the main surface of the semiconductor substrate 1 (semiconductor wafer SW) so that no trouble due to irradiation of light to the resist layer (photoresist layer) occurs because no resist layer itself is present, even if the insulating film 2 is wet etched while applying light (preferably, light of 140 lux or greater) to the main surface of the semiconductor wafer SW. On the other hand, when in the steps after Step S11, the semiconductor substrate 1 is exposed by wet etching of the insulating film while having the insulating film and a resist layer thereon on the main surface of the semiconductor substrate 1 (semiconductor wafer SW), it is possible to suppress or prevent a trouble due to irradiation of light to the resist layer (photoresist layer) by avoiding the main surface of the semiconductor substrate 1 (semiconductor wafer SW) from being irradiated with light of 100 lux or greater.

In the steps after Step S11, when the semiconductor substrate 1 is exposed by wet etching of the insulating film while having the insulating film and a resist layer (photoresist layer) thereon on the main surface of the semiconductor substrate 1 (semiconductor wafer SW), occurrence of a defect such as the pit 51 can be prevented even by avoiding light of 100 lux or greater from being irradiated to the main surface of the semiconductor substrate 1 (semiconductor wafer SW). This is because when the insulating film 2 is wet-etched to expose the semiconductor substrate 1 in Step S11, the semiconductor substrate 1 has, on the main surface thereof, no insulating film except the element isolation region 4 (no insulating film having charges accumulated therein) and steps after that, charges accumulated in the insulating film on the main surface of the semiconductor substrate 1 (semiconductor wafer SW) are not so many as those accumulated at the time of formation of the element isolation region 4.

Since the step of removing the insulating film 2 in Step S11 is a step easily generating the pit 51 and at the same time, a step conducted without a resist layer (photoresist layer), wet etching of the insulating film 2 is conducted while applying light (preferably light of 140 lux or greater) to the main surface of the semiconductor wafer SW in order to suppress (prevent) occurrence of the pit 51. On the other hand, the step of wet etching the insulating film to expose the semiconductor substrate 1 after Step S11 while having an insulating film and a resist layer lying thereon on the main surface of the semiconductor substrate 1 (semiconductor wafer SW) is a step not easily generating the pit 51 and at the same time, a step conducted with a resist layer on the insulating film. In order to suppress a quality change of the resist layer, light of 100 lux or greater is not irradiated to the main surface of the semiconductor substrate 1 (semiconductor wafer SW). Although the steps are the same from the standpoint of removing the insulating film formed on the main surface of the semiconductor substrate 1 (semiconductor wafer SW) by wet etching to expose the semiconductor substrate 1, two methods, that is, positive application of light (Step S11) and no application of light (steps after Step S11 and conducted with the resist layer on the insulating film) are used properly to provide a semiconductor device having improved reliability at an improved production yield.

Here, the step, after Step S11, of carrying out wet etching of the insulating film to expose the semiconductor substrate 1 while having the insulating film and a resist layer (photoresist layer) lying thereon on the main surface of the semiconductor substrate 1 (semiconductor wafer SW) is, for example, the above Step S14. The insulating film and the resist layer correspond to the insulating film 11 and the photoresist pattern PR3, respectively. Described specifically, in Step S14, the insulating film 11 in a region (in this step, the low breakdown voltage MIS region 1B) not covered with the photoresist pattern PR3 is removed by wet etching to expose the upper surface (that is, Si surface) of the semiconductor substrate 1. This wet etching is conducted so as not to irradiate light of 100 lux or greater to the main surface of the semiconductor substrate 1 (semiconductor wafer SW). This means that in the wet etching of the insulating film 11 in Step S14, the illuminance of the main surface of the semiconductor substrate 1 (semiconductor wafer SW) is adjusted to less than 100 lux, in other words, the main surface of the semiconductor substrate 1 is prevented from having a region having a illuminance of 100 lux or greater. This makes it possible to suppress a quality change (for example, hardening) of the photoresist pattern PR3 due to light during wet etching of the insulating film 11, to carry out subsequent removal of the photoresist pattern PR3 easily, and suppress or prevent generation of removal residues of the photoresist pattern PR3. As a result, a semiconductor device having improved reliability can be manufactured at an improved production yield. Moreover, an amount of the charges accumulated in the insulating film 11 just before the wet etching in Step S14 is much smaller than that of the charges accumulated in the insulating film 2 just before the wet etching in Step S11. Even if the light irradiated to the main surface of the semiconductor substrate 1 (semiconductor wafer SW) is controlled to less than 100 lux upon wet etching of the insulating film 11 in Step S14, occurrence of a defect corresponding to the pit 51 can be suppressed or prevented.

From another standpoint, when in the steps after Step S11, the semiconductor substrate 1 is exposed by wet etching of the insulating film while having the insulating film and a resist layer (photoresist layer) lying thereon on the main surface of the semiconductor substrate 1 (semiconductor wafer SW), the illuminance of the main surface of the semiconductor substrate 1 (semiconductor wafer SW) is adjusted to be lower than that on the main surface of the semiconductor substrate 1 (semiconductor wafer SW) in Step S11. More specifically, the illuminance on the main surface of the semiconductor substrate 1 (semiconductor wafer SW) during wet etching of the insulating film 11 in Step S14 is made lower than that of the main surface of the semiconductor substrate 1 (semiconductor wafer SW) during wet etching of the insulating film 2 in step S11. This produces an effect of suppressing or preventing occurrence of a defect corresponding to the pit 51 and also an effect of suppressing or preventing generation of a removal residue of the resist layer. The illuminance of the main surface of the semiconductor substrate 1 (semiconductor wafer SW) in Step S11 is preferably 140 lux or greater. In the steps after Step S11, when the semiconductor substrate 1 is exposed by carrying out (more specifically, in Step S14) wet etching of an insulating film while having, on the main surface of the semiconductor substrate 1, the insulating film and a resist layer lying thereon, the illuminance of the main surface of the semiconductor substrate 1 (semiconductor wafer SW) is preferably less than 100 lux. This makes it possible to improve the effect of suppressing or preventing occurrence of a defect corresponding to the pit 51, improve the effect of suppressing or preventing generation of a removal residue of the resist layer, and definitely provide a semiconductor device having improved reliability at an improved production yield.

The invention made by the present inventors has been described specifically based on the embodiment of it. The invention is however not limited to or by it. It is needless to say that it can be changed without departing from the gist of the present invention.

The present invention is effective when applied to a manufacturing technology of semiconductor devices.

What is claimed is:

1. A method of manufacturing a semiconductor device, comprising the steps of:
    (a) preparing a semiconductor substrate;
    (b) forming a first insulating film over the main surface of the semiconductor substrate;
    (c) forming an element isolating trench in the first insulating film and the semiconductor substrate by plasma dry etching of the first insulating film and the semiconductor substrate;
    (d) forming a second insulating film over the main surface of the semiconductor substrate so as to fill the trench;
    (e) removing the second insulating film outside the trench by CMP, while leaving the second insulating film in the trench;
    (f) after step (e), removing the first insulating film by wet etching to expose the semiconductor substrate, the first insulating film being wet etched while applying light of 140 lux or greater to the first insulating film;
    (g) after step (f), implanting a dopant into the semiconductor substrate to form a well; and
    (h) after the step (g), forming a gate insulating film of a MISFET over the well.

2. The method of manufacturing a semiconductor device according to claim 1,
    wherein in the step (f), the first insulating film is wet etched while the main surface of the semiconductor substrate is rotating.

3. The method of manufacturing a semiconductor device according to claim 2,
    wherein in the step (f), the first insulating film is wet etched by supplying an etching solution to the rotating semiconductor substrate.

4. The method of manufacturing a semiconductor device according to claim 3,
    wherein in the step (f), any of the regions of the main surface of the semiconductor substrate has a period of being irradiated with light of 140 lux or greater during wet etching of the first insulating film.

5. The method of manufacturing a semiconductor device according to claim 4,
    wherein the first insulating film is an oxide film.

6. The method of manufacturing a semiconductor device according to claim 5,
    wherein in the step (b), the first insulating film is formed by thermal oxidation.

7. The method of manufacturing a semiconductor device according to claim 6, further comprising:
    after the step (b) but before the step (c), (b1) forming a third insulating film over the first insulating film;
    in the step (c), forming the element isolating trench in the third insulating film, the first insulating film, and the semiconductor substrate by subjecting the third insulating film, the first insulating film, and the semiconductor substrate to plasma dry etching; and
    after the step (e) but before the step (f), (e1) removing the third insulating film to expose the first insulating film.

8. The method of manufacturing a semiconductor device according to claim 7,
    wherein the third insulating film is a silicon nitride film.

9. The method of manufacturing a semiconductor device according to claim 8, wherein in the step (d), the second insulating film is formed by plasma CVD.

10. The method of manufacturing a semiconductor device according to claim 9, wherein in the step (d), the second insulating film is formed by high-density plasma CVD.

11. The method of manufacturing a semiconductor device according to claim 10, wherein the second insulating film is a silicon oxide film.

12. The method of manufacturing a semiconductor device according to claim 11, wherein in the step (f), the first insulating film is wet etched while having no resist layer on the main surface of the semiconductor substrate.

13. The method of manufacturing a semiconductor device according to claim 1, wherein, after the step (h), when the gate insulating film is wet etched with a resist layer lying thereon, the main surface of the resist layer is prevented from irradiation of light having 100 lux or greater thereto.

14. A method of manufacturing a semiconductor device, comprising the steps of:
- (a) preparing a semiconductor substrate;
- (b) forming a first insulating film over the main surface of the semiconductor substrate;
- (c) forming an element isolating trench in the first insulating film and the semiconductor substrate by plasma dry etching of the first insulating film and the semiconductor substrate;
- (d) forming a second insulating film over the main surface of the semiconductor substrate so as to fill the trench;
- (e) removing the second insulating film by CMP to expose the first insulating film;
- (f) after step (e), removing the first insulating film by wet etching to expose the semiconductor substrate, the first insulating film being wet etched while applying light to the first insulating film;
- (g) after step (f), implanting a dopant into the semiconductor substrate to form a well;
- (h) after step (g), forming a gate insulating film of a MISFET over the well; and
- (i) selectively removing the gate insulating film by wet etching with a resist layer, wherein, the illuminance of the resist layer in step (i) is made lower than the illuminance of the first insulating film in the step (f).

15. The method of manufacturing a semiconductor device according to claim 1, wherein in the step (f), a p/n junction is not formed in the semiconductor substrate.

16. The method of manufacturing a semiconductor device according to claim 14, wherein in the step (f), a p/n junction is not formed in the semiconductor substrate.

\* \* \* \* \*